(12) United States Patent
Henley et al.

(10) Patent No.: US 9,859,458 B2
(45) Date of Patent: Jan. 2, 2018

(54) BOND AND RELEASE LAYER TRANSFER PROCESS

(71) Applicant: QMAT, Inc., Santa Clara, CA (US)

(72) Inventors: Francois J. Henley, Saratoga, CA (US); Sien Kang, Dublin, CA (US); Mingyu Zhong, Union City, CA (US); Minghang Li, Fremont, CA (US)

(73) Assignee: QMAT, INC., Santa Clara, CA (US)

( * ) Notice: Subject to any disclaimer, the term of this patent is extended or adjusted under 35 U.S.C. 154(b) by 0 days.

(21) Appl. No.: 15/186,184

(22) Filed: Jun. 17, 2016

(65) Prior Publication Data

US 2016/0372628 A1 Dec. 22, 2016

Related U.S. Application Data

(60) Provisional application No. 62/181,947, filed on Jun. 19, 2015.

(51) Int. Cl.
*H01L 21/00* (2006.01)
*H01L 33/00* (2010.01)
(Continued)

(52) U.S. Cl.
CPC ........ *H01L 33/0079* (2013.01); *H01L 33/007* (2013.01); *C30B 25/02* (2013.01);
(Continued)

(58) Field of Classification Search
CPC ............. H01L 33/0079; H01L 33/0075; H01L 2933/0058
(Continued)

(56) References Cited

U.S. PATENT DOCUMENTS 6,013,563 A   1/2000 Henley et al.
6,284,631 B1  9/2001 Henley et al.
(Continued)

FOREIGN PATENT DOCUMENTS

JP   2013-065589 A   4/2013
JP   2015-095589 A   5/2015

OTHER PUBLICATIONS

Xun Li et al., "Properties of GaN layers grown on N-face free-standing GaN substrates", Journal of Crystal Growth, 2015, pp. 81-85, vol. 413, Elsevier B.V.
(Continued)

*Primary Examiner* — Vu A Vu

(57) ABSTRACT

Embodiments transfer thin layers of material utilized in electronic devices (e.g., GaN for optoelectronic devices), from a donor to a handle substrate. Certain embodiments employ bond-and-release system(s) where release occurs along a cleave plane formed by implantation of particles into the donor. Some embodiments may rely upon release by converting components from solid to liquid under carefully controlled thermal conditions (e.g., solder-based materials and/or thermal decomposition of Indium-containing materials). Some embodiments utilize laser-induced film release processes using epitaxially grown or implanted regions as an optically absorptive region. A single bond-and-release sequence may involve processing an exposed N-face of GaN material. Multiple bond-and-release sequences (involving processing an exposed Ga-face of GaN material) may be employed in series, for example utilizing a temporary handle substrate as an intermediary. Particular embodiments form template blanks of high quality GaN suitable for manufacturing High Brightness-Light Emitting Diode (HB-LED) devices.

26 Claims, 17 Drawing Sheets

(51) Int. Cl.

| | |
|---|---|
| C30B 33/04 | (2006.01) |
| H01L 21/265 | (2006.01) |
| H01L 21/762 | (2006.01) |
| H01L 21/3105 | (2006.01) |
| C30B 25/02 | (2006.01) |
| H01L 21/04 | (2006.01) |
| H01L 29/16 | (2006.01) |
| C30B 29/40 | (2006.01) |
| C30B 25/18 | (2006.01) |

(52) U.S. Cl.
CPC .......... C30B 25/18 (2013.01); C30B 29/403 (2013.01); C30B 29/406 (2013.01); C30B 33/04 (2013.01); H01L 21/0445 (2013.01); H01L 21/265 (2013.01); H01L 21/31058 (2013.01); H01L 21/76254 (2013.01); H01L 29/1608 (2013.01); Y10S 117/915 (2013.01)

(58) Field of Classification Search
USPC .......................................................... 438/27
See application file for complete search history.

(56) References Cited

U.S. PATENT DOCUMENTS

| | | | |
|---|---|---|---|
| 6,291,313 | B1 | 9/2001 | Henley et al. |
| 6,391,740 | B1 | 5/2002 | Cheung et al. |
| 6,511,899 | B1 | 1/2003 | Henley et al. |
| 6,559,075 | B1 * | 5/2003 | Kelly ................ H01L 21/6835 257/E21.599 |
| 6,632,724 | B2 | 10/2003 | Henley et al. |
| 6,790,747 | B2 | 9/2004 | Henley et al. |
| 7,160,790 | B2 | 1/2007 | Henley et al. |
| 7,348,258 | B2 | 3/2008 | Henley et al. |
| 7,410,887 | B2 | 8/2008 | Henley et al. |
| 7,470,600 | B2 | 12/2008 | Henley et al. |
| 7,759,220 | B2 | 7/2010 | Henley |
| 7,776,717 | B2 | 8/2010 | Henley et al. |
| 7,811,900 | B2 | 10/2010 | Henley |
| 7,863,157 | B2 | 1/2011 | Henley et al. |
| 7,910,458 | B2 | 3/2011 | Henley |
| 7,911,016 | B2 | 3/2011 | Henley |
| 7,939,428 | B2 * | 5/2011 | Boussagol ............. C30B 25/18 257/E21.567 |
| 8,012,852 | B2 | 9/2011 | Henley et al. |
| 8,110,480 | B2 | 2/2012 | Henley |
| 8,124,499 | B2 | 2/2012 | Henley et al. |
| 8,163,581 | B1 * | 4/2012 | Or-Bach ............. H01L 31/0725 438/39 |
| 8,293,619 | B2 | 10/2012 | Henley |
| 2008/0128641 | A1 | 6/2008 | Henley et al. |
| 2009/0206275 | A1 | 8/2009 | Henley et al. |
| 2010/0317140 | A1 | 12/2010 | Brailove et al. |
| 2011/0156212 | A1 * | 6/2011 | Arena ................. H01L 21/187 257/615 |
| 2012/0234887 | A1 | 9/2012 | Henley et al. |
| 2014/0197419 | A1 | 7/2014 | Henley et al. |

OTHER PUBLICATIONS

A.R.A. Zauner et al., "Homo-epitaxial growth on the N-face of GaN single crystals: the influence of the misorientation on the surface morphology", Journal of Crystal Growth, 2002, pp. 14-21, vol. 240, Elsevier Science B.V.

Warren Cornelius Welch, III, "Vacuum and Hermetic Packaging of MEMS Using Solder", dissertation for Doctor of Philosophy, 2008, pp. 1-204, University of Michigan.

Daisuke Lida et al., "Laser lift-off technique for freestanding GaN substrate using an in droplet formed by thermal decomposition of GaInN and its application to light-emitting diodes", Applied Physics Letters, 2014, pp. 072101-1-072101-4, vol. 105, AIP Publishing LLC.

B S Li et al., "Structures and optical properties of $H_2$-implanted GaN epi-layers", Journal of Physics D: Applied Physics, 2015, pp. 1-12, vol. 48, IOP Publishing Ltd.

Paul K. Chu et al., "Recent Applications of Plasma Immersion Ion Implantation," Semiconductor International, Jun. 1996, pp. 165-172.

Paul K. Chu et al., "Plasma immersion ion implantation—a fledgling technique for semiconductor processing," Materials Science and Engineering Reports: A Review Journal, 1996, pp. 207-280, vol. R17, Elsevier Science S.A.

W. K. Choi et al.: "Densification of radio frequency sputtered silicon oxide films by rapid thermal annealing", Journal of Applied Physics, Feb. 15, 1998, pp. 2308-2314, vol. 83, No. 4, American Institute of Physics.

J.L. Weyher et al., "Morphological and structural characteristics of homoepitaxial GaN grown by metalorganic chemical vapour deposition (MOCVD)", Journal of Crystal Growth, 1999, pp. 419-428, vol. 204, Elsevier Science B.V.

"Information About FOx ®-1x and FOx-2x Flowable Oxides", Product Information Flowable Oxides, 2005, pp. 1-4, Dow Corning Corporation.

V. Dragoi et al., "Adhesive wafer bonding for MEMS applications" Proceedings of SPIE vol. 5116, 2003, pp. 160-167, SPIE.

H. C. Lin et al., "Low temperature wafer bonding by spin on glass" J. Vac. Sci. Technol. B, Mar./Apr. 2002, pp. 752-754, vol. 20, No. 2, American Vacuum Society.

Sergey P. Moshchenko et al., "Modelling the Localized Surface Plasmon Resonance of Nanoclusters of Group III Metals and Semimetallic Antimony", Journal of Siberian Federal University, Mathematics & Physics, 2014, pp. 211-217, vol. 7, No. 2, Siberian Federal University.

John A. Smythe, "Spin-On-Dielectrics: Characteristics and Modeling," thesis for Master of Science in Materials Science and Engineering, 2004, pp. 1-87, University of Washington.

"AF 45 Thin Borosilicate Glass" Product Information, pp. 1-2, Schott North America Inc.

"*Dow Corning*® XR-1541 E-Beam Resist" Product Information Lithography, 2008, pp. 1-2, Dow Corning Corporation.

International Search Report and Written Opinion for PCT/US2016/038240, filed Jun. 17, 2016.

* cited by examiner

BOND AND RELEASE LAYER TRANSFER PROCESS

CROSS-REFERENCE TO RELATED APPLICATION

The instant nonprovisional patent application claims priority to U.S. provisional patent application No. 62/181,947 filed Jun. 19, 2015 and which is incorporated by reference in its entirety herein for all purposes.

BACKGROUND

Conventional techniques for manufacturing electronic devices, may involve the formation and manipulation of thin layers of materials. Accordingly, there is a need in the art for methods and apparatuses performing a layer transfer process involving bonding and releasing material layers.

SUMMARY

Embodiments transfer thin layers of material utilized in electronic devices (e.g., GaN for optoelectronic devices), from a donor to a handle substrate. Certain embodiments employ bond-and-release system(s) where release occurs along a cleave plane formed by implantation of particles into the donor. Some embodiments may rely upon release by converting components from solid to liquid under carefully controlled thermal conditions (e.g., solder-based materials and/or thermal decomposition of Indium-containing materials). A single bond-and-release sequence may involve processing an exposed N-face of GaN material. Multiple bond-and-release sequences (involving processing an exposed Ga-face of GaN material) may be employed in series, for example utilizing a temporary handle substrate as an intermediary. Particular embodiments form template blanks of high quality GaN suitable for manufacturing High Brightness-Light Emitting Diode (HB-LED) devices.

DETAILED DESCRIPTION

Semiconducting materials find many uses, for example in the formation of logic devices, solar cells, and increasingly, illumination. One type of semiconductor device that can be used for illumination is the high-brightness light emitting diode (HB-LED). In contrast with traditional incandescent or even fluorescent lighting technology, HB-LED's offer significant advantages in terms of reduced power consumption and reliability.

An optoelectronic device such as a HB-LED may rely upon materials exhibiting semiconductor properties, including but limited to type III/V materials such as gallium nitride (GaN) that is available in various degrees of crystalline order. However, these materials are often difficult to manufacture.

Figure 1A:
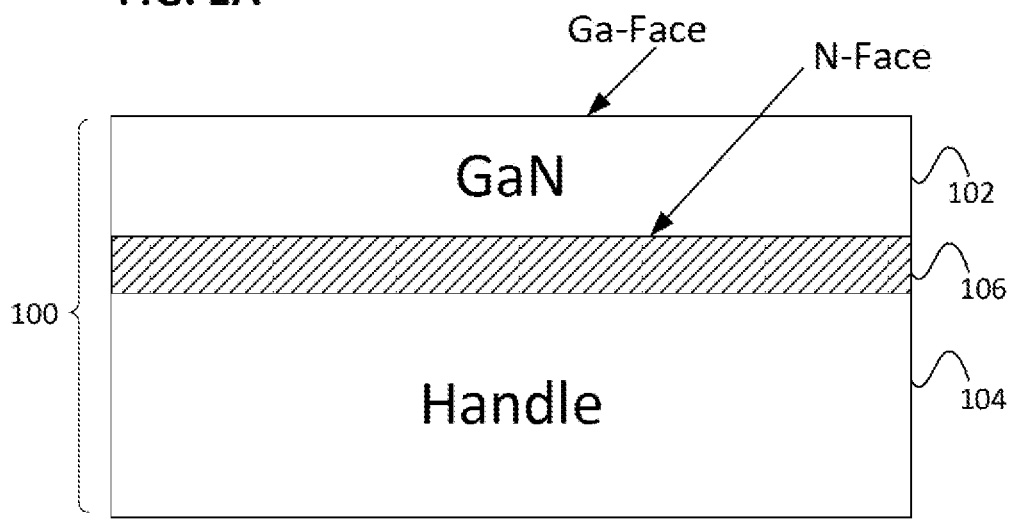
FIG. 1A shows a simplified view of a template blank which may be prepared utilizing a bond and release process according to an embodiment.
Figure 1B:
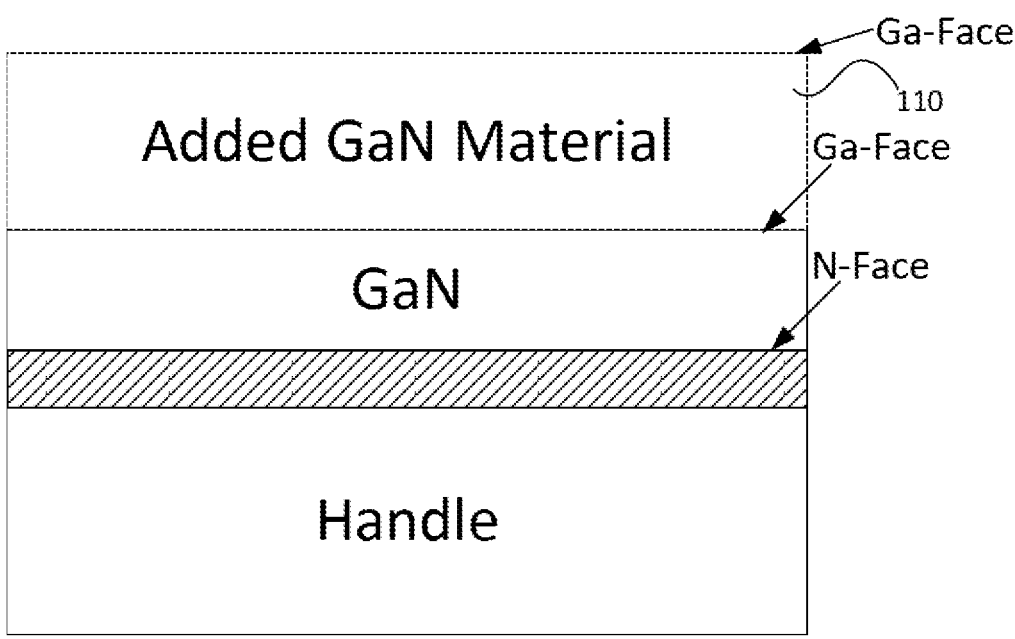
FIG. 1B shows further processing of the template blank of FIG. 1A to create an optoelectronic device.

One fabrication approach is illustrated in FIGS. 1A-B. There, a blank workpiece 100 is provided. This template blank comprises a thin, high quality layer of GaN 102 overlying a substrate 104 (also referred to herein as a handle substrate) and separated therefrom by a dielectric layer 106, which typically comprises an oxide.

Also, the structure can have an electrically conductive layer instead of the oxide and a buried reflective layer and conductive handle to allow a front emitting, vertical device structure. Here, vertical structure refers to the notion that the current goes through the GaN vertically and through the bottom handle. Alternatively, the light can go through the handle.

The substrate can comprise glass, quartz, polymeric, metal or metal alloy, or other composites, and the like. In other embodiments, the substrate can comprise any homogeneous, graded, or multilayered material, or any combination of these. That is, the substrate can be made of almost any monocrystalline, polycrystalline, or even amorphous type substrate. The substrate can comprise sapphire. The substrate can be made of amorphous or crystalline III/V materials such as gallium arsenide, gallium nitride (GaN), AlN, and others. Additionally, the substrate can be metal or metal alloy, glass or quartz combinations, plastics, and polymers, amorphous or crystalline silicon carbide, germanium, and silicon.

Moreover, a backing substrate may be provided to add rigidity. The backing substrate may have a thickness and material that is adequate to provide an effective deflection characteristic of a multilayered structure comprising the backing substrate and another (e.g., handle) substrate to be suitable for a thickness of GaN bearing material that is to be transferred as is discussed extensively below.

As merely an example, the substrate (possibly including a backing substrate) can be a silicon wafer for a quartz handle substrate. Other types of materials and certain thicknesses such as plastic, metal, glass, quartz, composites, and the like can be used to provide the rigidity to the combined backing and handle substrate structures.

As shown in FIG. 1B, processing the exposed surface of the GaN template may allow for the formation of additional thickness 110 of high quality GaN material. This additional GaN may be formed by Metallo-Organic Chemical Vapor Deposition (MO-CVD), for example. That additional thickness of GaN material (with or without the accompanying substrate and/or dielectric material) may ultimately be incorporated into a larger optoelectronic device structure (such as a HB-LED). If high-temperature processes are utilized (for example to add GaN material thickness 110), some substrate materials may not be compatible with such processes. AlN, sapphire, some metals such as Molybdenum or Tungsten will be compatible; however glass, plastics and other relatively low melting point materials may not be suited for such applications.

The particular embodiment of FIG. 1A shows the N face 103 of the GaN layer bonded to the dielectric, with the Ga face 105 of the GaN layer exposed for further processing. This is because the Ga face has traditionally proven more amenable to the growth of high quality GaN than the N face.

It is emphasized, however, that other embodiments are possible. For example some applications (e.g., power electronics) may call for growth of GaN material from the N face, rather than from the Ga face. Incorporated by reference herein for all purposes are the following articles: Xun Li et al., "Properties of GaN layers grown on N-face free-standing GaN substrates", Journal of Crystal Growth 413, 81-85 (2015); A. R. A. Zauner et al., "Homo-epitaxial growth on the N-face of GaN single crystals: the influence of the misorientation on the surface morphology", Journal of Crystal Growth 240, 14-21 (2002). Accordingly, template blank structures of alternative embodiments could feature a GaN layer having an N face that is exposed, rather than a Ga face.

Described now in detail, are various layer transfer processes which may be useful for example in fabricating a GaN-containing template blank structure such as is shown in FIG. 1A.

Specifically, particular embodiments transfer thin layers of material utilized in electronic devices (e.g., GaN for optoelectronic devices), from a donor to a handle substrate. Certain embodiments employ bond-and-release system(s) where release occurs along a cleave plane formed by implantation of particles into the donor. Some embodiments may rely upon release by converting components from solid to liquid under carefully controlled thermal conditions (e.g., solder-based materials and/or thermal decomposition of Indium-containing materials). A single bond-and-release sequence may involve processing an exposed N-face of GaN material. Multiple bond-and-release sequences (involving processing an exposed Ga-face of GaN material) may be employed in series, for example utilizing a temporary handle substrate as an intermediary. Particular embodiments form template blanks of high quality GaN suitable for manufacturing High Brightness-Light Emitting Diode (HB-LED) devices.

Figure 2:
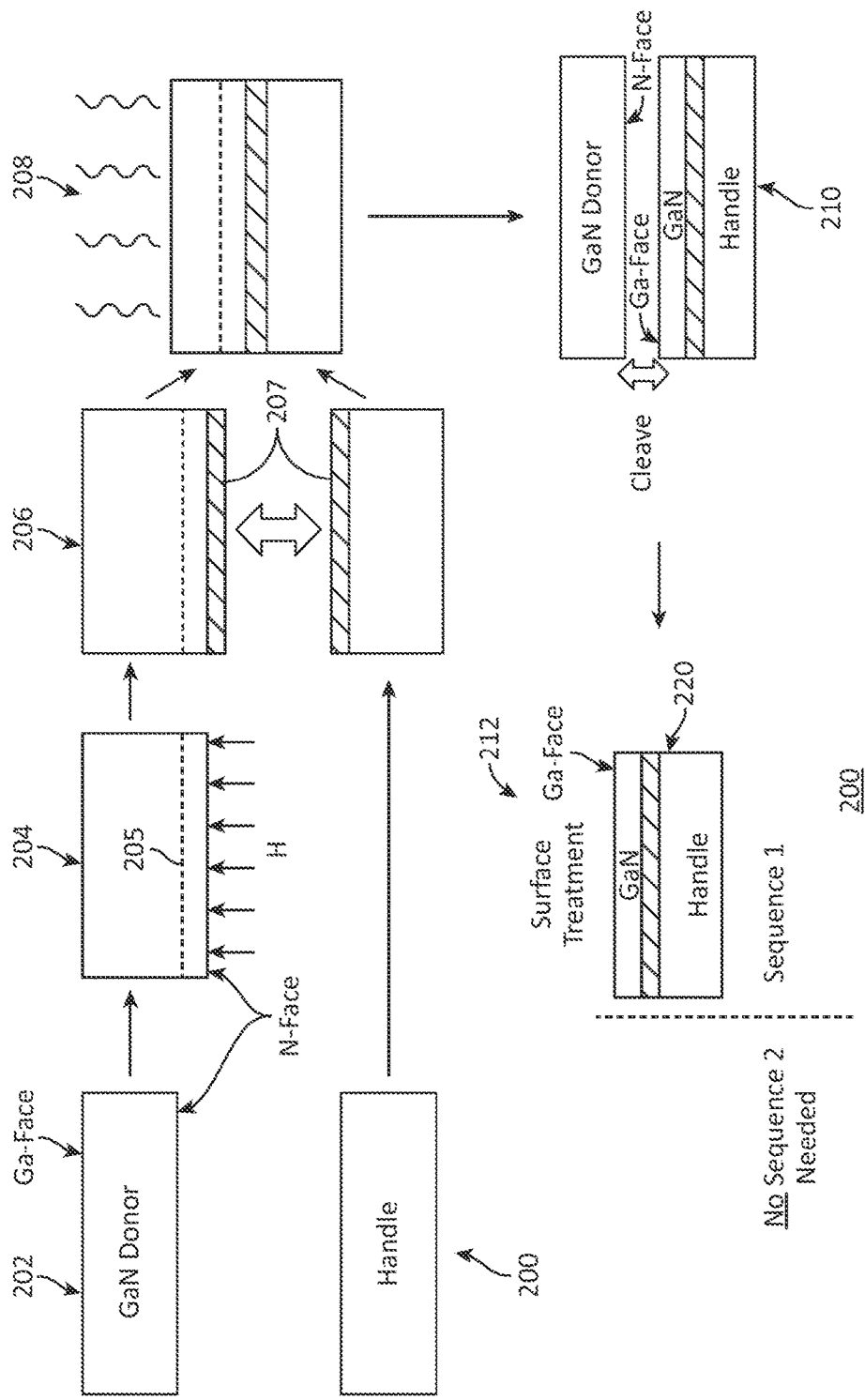
FIG. 2 shows an overview of a first exemplary process according to an embodiment.

FIG. 2 shows an overview of a first exemplary process 200 according to an embodiment. The process flow of this embodiment comprises a single bond-and-release sequence comprising bonding to an implanted GaN donor, followed by release by cleaving along a plane resulting from the implant.

Specifically, in a first step 202 a handle substrate and a GaN donor having a Ga-face and an N-face are provided. In a particular embodiment the handle and the GaN donor may be 2" wafers, but they are not limited to being of any specific size or dimension.

In a next step 204, the GaN donor is subjected to energetic implantation of particles (e.g., hydrogen) via its N-face. This implant creates a sub-surface cleave plane 205 in the GaN donor.

Subjecting the GaN donor to implantation with accelerated particles, forms the cleave region. In some embodiments this cleave region may lie at a depth of between about 10-20 um underneath the surface of the bulk material. In certain embodiments the cleave region may lie between about 0.05 um to about 70 um. In particular embodiments the cleave region may be at a depth of from about 0.05 micrometers to about 1 micrometers. Sample depths for the cleave region can include about 0.05 um, about 1 um, about 2 um, about 5 um, about 10 um, about 20 um, abut 30 um, and about 50 um.

Forming a cleave region may depend upon factors such as the target material, the crystal orientation of the target material, the nature of the implanted particle(s), the dose, energy, and temperature of implantation, and the direction of implantation. Such implantation may share one or more characteristics described in detail in connection with the following patent applications, all of which are incorporated by reference in their entireties herein: U.S. patent application Ser. Nos. 12/789,361; 12/730,113; 11/935,197; 11/936,582; 12/019,886; 12/244,687; 11/685,686; 11/784,524; 11/852,088.

In a next step 206, a bond-and-release system 207 is formed on N-face of the GaN donor, and/or on one side of the handle substrate. In certain embodiments, this bond-and-release system may comprise silicon oxide.

In particular embodiments, this bond-and-release system can be formed by exposing the workpieces to oxidizing conditions. In some embodiments this bond-and-release system may be formed by the addition of oxide, e.g., as spin-on-glass (SOG), or other spin on material (e.g., XR-1541 hydrogen silsesquioxane electron beam spin-on resist available from Dow Corning), and/or SiO2 formed by Plasma Enhanced Chemical Vapor Deposition (PECVD) techniques. In certain embodiments the bond-and-release system may be formed by sputtering methods.

In step 208, bonding is performed by placing the oxide-bearing surfaces of the donor and handle into contact, followed by heating. Other acts may be performed at this time, such as touch polishing prior to bonding.

Step 210 shows the subsequent release. Specifically, the application of energy results in cleaving along the cleave plane in the donor. This cleaving produces the desired template blank 220 bearing the cleaved thin GaN film with its Ga face exposed.

In certain embodiments the thickness of material of the implanted surface of the donor is cleaved from the bulk material using the cleave region formed by using relatively high H+ proton implant energies in the MeV range. This produces a detached layer of semiconductor material having a thickness of between about 10-20 um. In other embodiments using bonded layer-transfer, thinner cleaved layers of 0.05-1 um may be used. For producing GaN cleaved films of these thicknesses, lower H+ proton implant energies ranging from approximately 5-180 keV may be used. For example, 40 keV H+ proton energy would produce a GaN cleaved film of approximately 0.25 um in thickness. It is understood that $H_2+$ can also be utilized for this implant step. In such cases, the dose rate would be doubled while the effective H+ energy would be halved. For example, a 80 keV $H_2+$ implant could have the same detached layer thickness (range) than a 40 keV H+ implant. However the dose rate would be double the H+ dose rate for the same implant current.

The cleaving may take place utilizing the application of various forms of energy, and may exhibit one or more of the characteristics disclosed in any of the patent applications incorporated by reference above. In a particular embodiment, this cleaving may take place utilizing a compressional force applied in the form of a static gas in a high pressure chamber containing the implanted bulk material. The application of energy in various forms to accomplish cleaving according to particular embodiments is also described in the U.S. Pat. No. 6,013,563 incorporated by reference herein for all purposes.

As described in connection with the following figures, and in further detail below, a cleaving process may itself comprise one or more steps. For example, cleaving may comprise initiation performed under certain conditions, followed by propagation performed under different conditions.

Returning to FIG. 2, step 212 shows further steps, such as treatment of the surface of the GaN surface. Processes such as polishing, reactive ion etching (RIE), and/or ion beam assisted etching can be used at this stage in order to remove ion-damaged layers and reduce roughness. Such treatment may reduce roughness in the exposed surface of the Ga-face, thereby making it more amenable to the addition of high quality GaN as discussed earlier in connection with FIG. 1B.

Figure 2A:
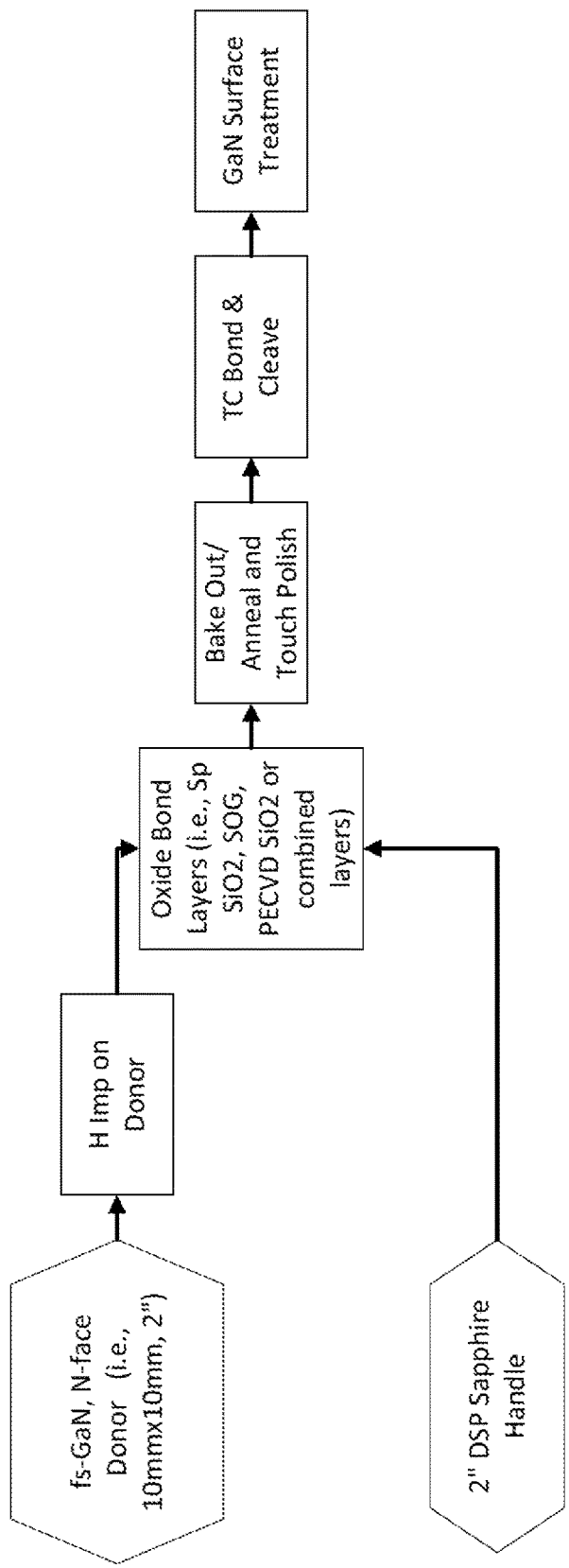
FIG. 2A is a simplified diagram summarizing the process flow according to the embodiment of FIG. 2.

FIG. 2A is a simplified diagram summarizing the process flow according to the embodiment of FIG. 2.

The above sequence of steps provide a method according to certain embodiments of the present invention. Other alternatives can also be provided where steps may be added, one or more steps may be removed, or one or more steps may be provided in a different sequence. For example in an alternative embodiment, particle implantation could take place after the formation of oxide bond layers, and before bonding.

Also, it is further noted alternative embodiments may utilize bond-and-release systems other than the oxide formation described above. One example of such an alternate bond-and-release system utilizes solder, as is described below in connection with FIG. 3. Such embodiments would likely also include the formation of oxide, in order to result in the template blank having the desired structure shown in FIG. 1A.

While the particular process flow of the embodiment shown in FIGS. 2-2A is viable, conditions (e.g., thermal) arising before, during, and/or after utilization of the oxide bond-and-release sequence, can adversely affect the quality of the overlying GaN material. In particular, under certain circumstances mismatch in the coefficient of thermal expansion (CTE) between the GaN, the dielectric (oxide) and the handle substrate can undesirably result in surface features deleteriously affecting the quality of the crystalline structure of the GaN. This in turn can degrade the quality of any added GaN added above.

The coefficient of thermal expansion (CTE) of GaN may be taken as the effective CTE of the bonding surface. If the surface is along the c-plane (0001) for example, the effective CTE is isotropic and about 5.5 ppm/° C. Along other planes, the CTE may be anisotropic. The effective CTE may be taken as the average CTE of the surface plane.

Figure 3:
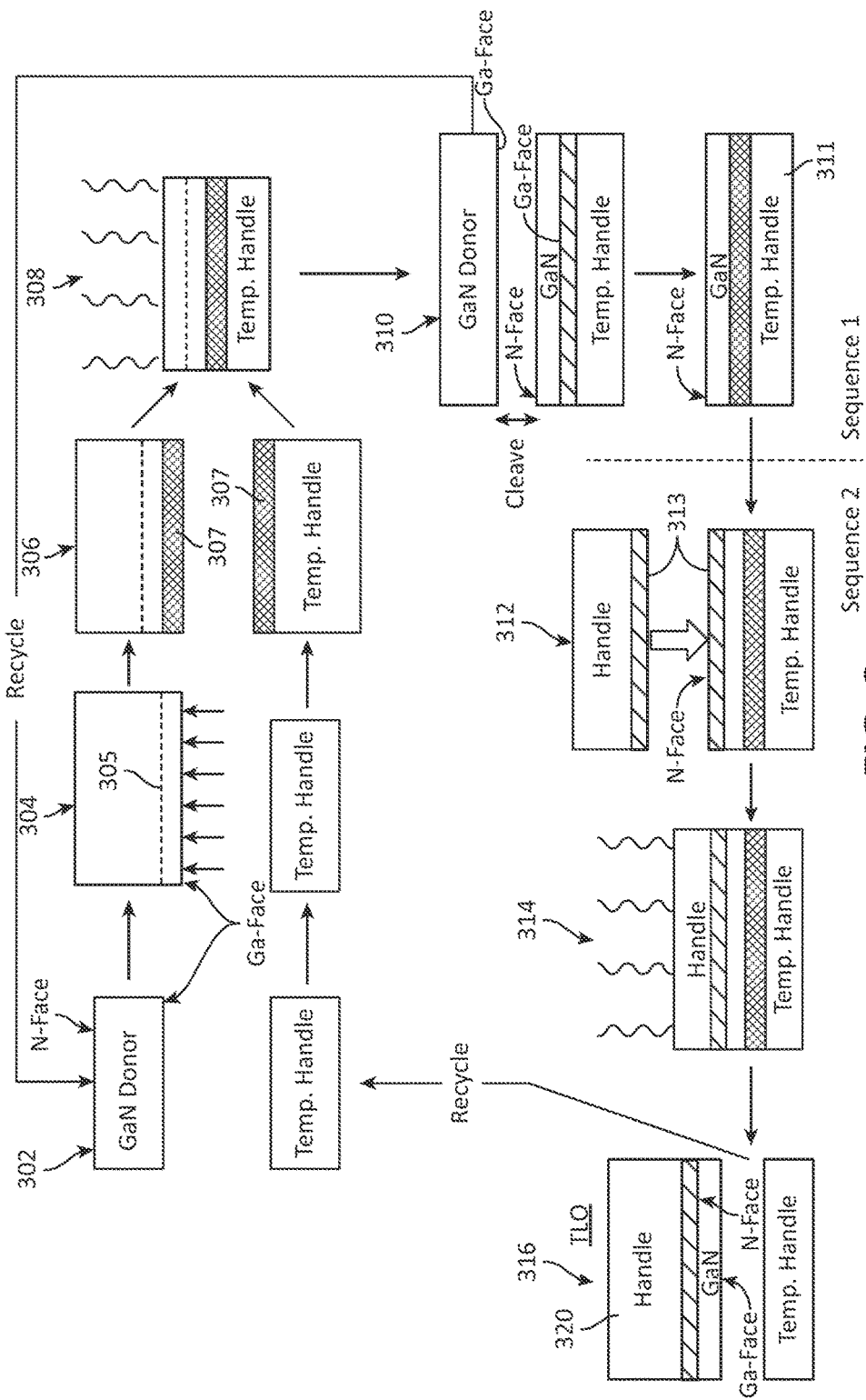
FIG. 3 shows an overview of a second exemplary process according to an embodiment.

Accordingly, FIG. 3 shows an overview of a second exemplary process 300 of an embodiment. This process flow comprises two successive bond-and-release sequences, and an intermediate handle substrate (also referred to herein as a transfer substrate). A first bond-and-release sequence may introduce solder bonding to the transfer substrate, followed by cleaving in the implanted GaN donor. Some material systems may employ Transient Liquid-Phase (TLP) bonding as discussed below. A second bond-and-release sequence involving the handle substrate may utilize oxide bonding in the manner indicated above, followed by release predicated upon melting temperatures of different phases of the first, solder based bond-and-release system.

Specifically, in a first step 302 a temporary handle substrate and a GaN donor having a Ga-face and an N-face are provided. In one embodiment the temporary handle substrate may comprise sapphire. In a particular embodiment the handle and the GaN donor may be 2" wafers, but they are not limited to being of any specific size or dimension.

In a next step 304, the GaN donor is subjected to energetic implantation of particles (e.g., hydrogen) via its Ga-face. This implant creates a sub-surface cleave plane 305 in the GaN donor.

In step 306, a first bond-and-release system 307 is formed on the temporary handle substrate. This bond-and-release system may be solder based, with phases exhibiting different melting temperatures, being formed at different times.

One example of such a solder based system comprises Tin (Sn) and Copper (Cu), with titanium present as a bond enhancement layer at one or more stages. Examples of solder-based systems can include but are not limited to those listed in the following table.

| Material System | Process Time and Temp. | Re-melt Temp. |
| --- | --- | --- |
| Copper-Indium | 4 min at 180° C. | >307° C. |
| Copper-Tin | 4 min at 280° C. | >415° C. |
| Silver-Tin | 60 min at 250° C. | >600° C. |
| Silver-Indium | 120 min at 175° C. | >880° C. |
| Gold-Tin | 15 min at 260° C. | >278° C. |
| Gold-Indium | 0.5 min at 200° C. | >495° C. |
| Nickel-Tin | 6 min at 300° C. | >400° C. |
| Titanium-Tin | 6 min at 275° C. | >600° C. |

Further details regarding behavior of such solder based bond-and-release systems, is further described below in connection with FIG. 3B.

In certain embodiments, a separate release layer can be interposed between the temporary handle and the solder layer to allow the release process to occur. The function of the solder layer would be to help accommodate potential CTE mismatches between the donor and the releasable substrates. Such a separate release layer could be formed by Indium-containing materials (such as InN) having melting point characteristics that are desirable to disrupt physical contact between a temporary handle substrate and overlying material. The behavior of indium-containing materials is discussed further in detail later below.

In step 308, bonding is accomplished by placing the surfaces of the GaN donor and temporary handle substrates into contact, followed by heating.

Step 310 shows the subsequent first release. Specifically, the application of energy results in cleaving along the cleave plane in the donor. This cleaving produces an intermediate product 311 comprising the temporary handle substrate bearing the separated GaN layer with its N-face exposed. This temporary product may be subjected to further processing, for example touch polishing and/or a plasma etch treatment to reduce surface roughness. The donor GaN material can be recycled for further use as shown.

Step 312 shows the formation of the second bond-and-release system 313. In the manner previously described for the (sole) bond-and-release system of the embodiment of FIG. 2, this second bond-and-release system of FIG. 3 may comprise oxide formation on the exposed GaN N-face of the intermediate product, and on a handle substrate. This oxide may comprise SOG, PE-CVD or sputtered SiO2, etc.

Step 314 shows the second bonding, with the oxide bearing surface of GaN and the handle substrate placed into contact and exposed to thermal conditions.

Step 316 shows the second release. In particular, the application of thermal energy causes re-melting of the solder phase or the decomposition of a buried release layer such as InN. This allows separation of the GaN layer from the transfer substrate, and after etching the solder and other release films, forms the resulting template blank structure 320. Desirably, the Ga-face of the GaN layer is exposed for further processing (e.g., addition of GaN material as described above in connection with FIG. 1B).

In certain embodiments, thermal energy is applied in a global manner to result in this second release. Such global application of thermal energy is herein referred to as Thermal Lift Off (TLO).

Alternatively, the thermal energy may be applied in a localized manner to result in this second release. For example, in some embodiments the temporary transfer substrate may be transparent to certain wavelengths of incident radiation. This could allow a beam of concentrated energy (e.g., from a laser) to be applied through the temporary transfer substrate to heat the bond-and-release material. Such local application of thermal energy for release purposes is also referred to herein as Laser Lift Off (LLO).

Figure 3A:
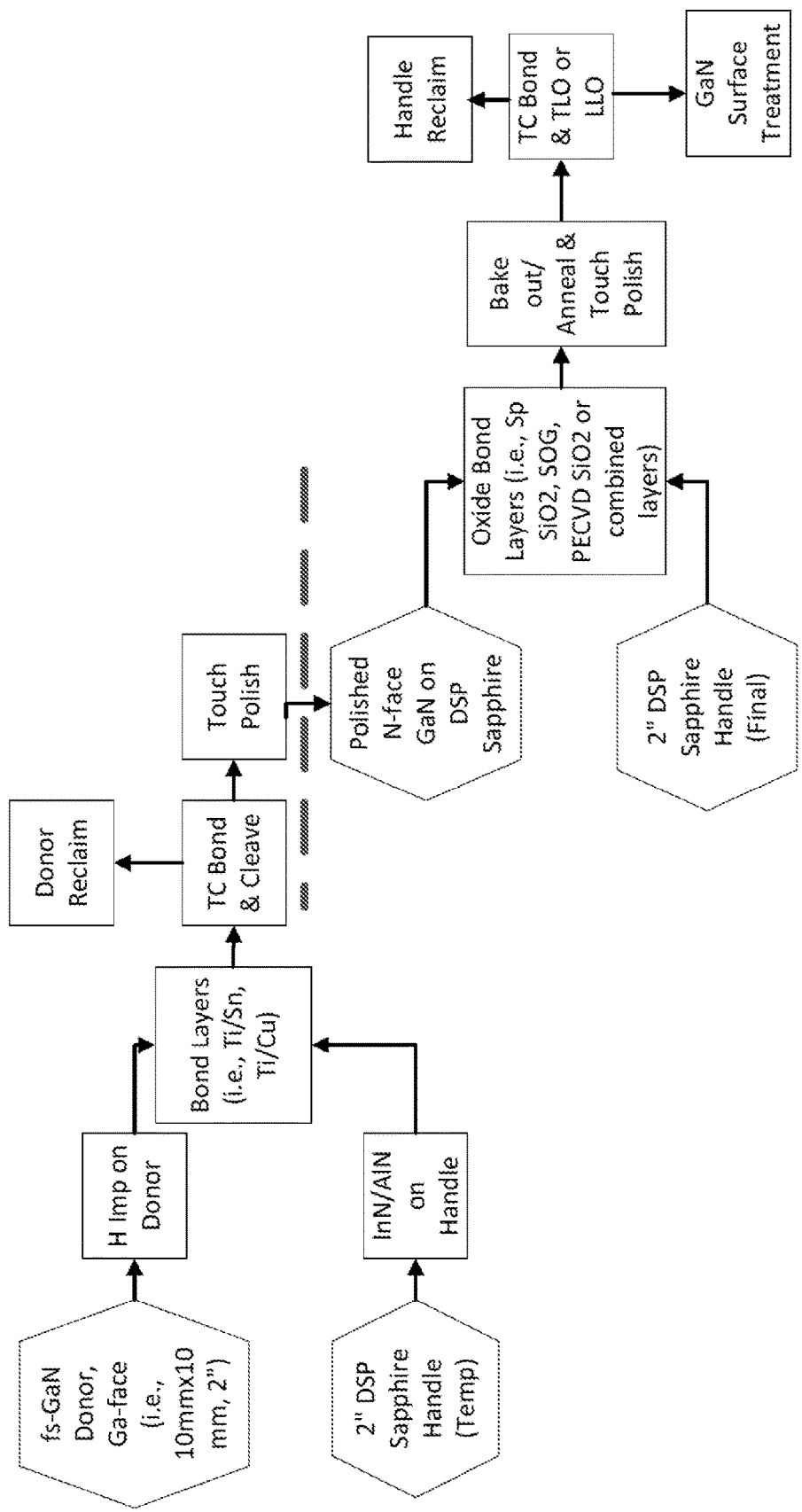
FIG. 3A is a simplified diagram summarizing the process flow according to the embodiment of FIG. 3.

FIG. 3A is a simplified diagram summarizing the process flow according to the embodiment of FIG. 3.

The above sequence of steps provide a method according to certain embodiments of the present invention. Other alternatives can also be provided where steps may be added, one or more steps may be removed, or one or more steps may be provided in a different sequence without departing from the scope of the claims herein.

Figure 3B:
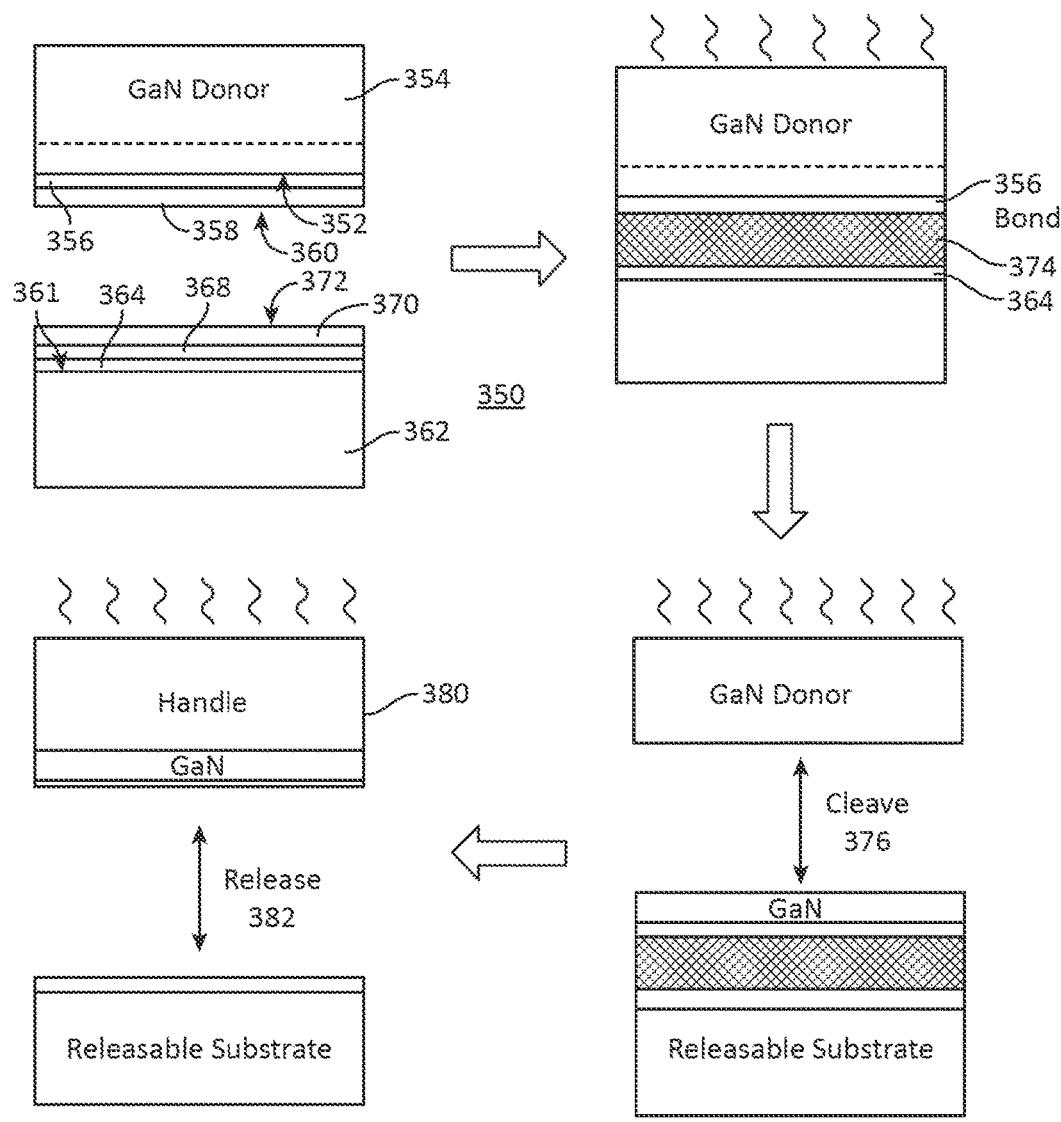
FIG. 3B shows simplified views of a soldering process which may be employed according to particular embodiments.

FIG. 3B shows simplified cross-sectional views detailing temporary bonding achieved through use of a soldering process 350. First, a Ga-face 352 of the implanted reusable GaN substrate 354 is coated first with a layer of Ti 356, and then with a layer of Cu 358 to form surface 360. These materials may be formed in an economical manner at close to room temperature and ambient pressure utilizing a plating process.

The surface 361 of the releasable substrate 362 is also coated first with a layer of Ti 364, and then with a layer of Cu 368. Then, solder 370 comprising tin (Sn) is applied to form surface 372. Again, this may be accomplished through metal plating techniques occurring at near-ambient pressure that do not require heating to high temperatures.

Then, the two surfaces 360, 372 are placed into contact, and bonding is achieved by application of thermal energy. In particular, the following thesis is incorporated by reference in its entirety herein: Warren C. Cornelius III, "Vacuum and Hermetic Packaging of MEMS Using Solder", University of Michigan (2008). Described therein are a number of techniques, including Transient Liquid Phase (TLP) bonding.

In particular, plating of one or both of the Cu layers of the releasable substrate and/or the implanted reusable substrate with tin (Sn) solder, followed by heating, may accomplish the temporary bonding utilizing a Sn/Cu phase 374. During this process the tin melts at about 232° C. and incorporates the copper to form a first Sn/Cu phase ($Cu_6Sn_5$) at a lower temperature (around 280° C.). This soldering process consumes the original Cu material.

With further heating the first Sn/Cu phase is converted into a second, more stable phase ($Cu_3Sn$). That second phase is sufficiently stable to withstand higher temperatures, for example as may be encountered during a thermally-based (~400° C.) cleaving process 376 as shown in FIG. 3B.

Then as further shown in FIG. 3B, after the cleaving and the attachment of the cleaved GaN to a permanent handle substrate 380, the temporary substrate/cleaved GaN/releasable substrate combination may be heated to melt the solder and remove the temporary substrate. With a TLP system comprising Cu/Sn, this release 382 may be accomplished by heating to >415° C. (greater than the cleaving temperature).

In certain embodiments, this heating to release may comprise global heating (e.g., utilizing lamps, furnaces) of the substrate/cleaved GaN layer combination. In other embodiments, this heating for release may comprise laser lift-off, with the laser applied through the backside of an optically conducting transfer substrate, or through an optically conducting permanent substrate.

While the instant embodiment has utilized a TLP system comprising Sn/Cu, this is not required and other approaches could be employed. The previous table provides a list of a variety of possible TLP systems which could be suitable, depending upon factors such as material compatibility and the temperatures expected to be encountered during the cleaving process.

Still other approaches are possible. For example, in the process flow of FIG. 3B, the Ti layer underlying the Cu, primarily performs a wetting function to promote adhesion of the solder. Accordingly, omitting the Ti layer from the implanted face of the reusable substrate, could serve to weaken the solder bond, thereby facilitating releasing of that bond at a later time. Such an approach could be employed either alone or in combination with a temperature-based release process.

Embodiments employing releasable bonding utilizing a soldering technique may offer one or more benefits. One possible benefit is reduced cost.

Specifically, the metals and solder can be formed on the GaN and/or the releasable substrate via a plating process. Such plating processes are well-known, and do not require high temperatures and/or reduced pressure environments that can contribute to the cost of the machinery.

Another possible benefit of using a soldering technique according to embodiments may be simplified process flow. That is, application of the metal layers used in soldering over the GaN face may avoid the need for certain additional processing steps of that face. For example, plating of metal on that surface may prevent the formation of an oxide surface that could need to be removed. Also, the metal plating may avoid the need for use of a flux in the soldering process.

The embodiment just described utilizes a bond-and-release system that is solder based involving the formation of phases having different thermal properties (e.g., melting point). However, bond-and-release systems that are other than solder based could be used in alternative embodiments. One example of such an alternative system is indium-based.

Specifically, an InN layer having sufficient absorption at the LLO laser wavelength or simply to decompose thermally, can be utilized as a release layer. This layer can be interposed between the glass temporary substrate and the solder or oxide bond layer. During the second step release, the layer can be made to decompose and release by a thermal treatment at about 650-700 C or by the application of a laser such as a 532 nm (doubled-YAG) or 355 nm (tripled-YAG) laser. At these wavelengths, the laser energy is strongly absorbed by the InN layer and causes the film to locally decompose into In metal and nitrogen gas, thereby releasing the glass temporary substrate. For a 3000 Å sputtered InN layer, 532 nm fluences of roughly 100-500 mJ/cm$^2$ at pulse widths of 30-50 nsec were found effective in releasing the film. Shorter (sub-nsec) laser systems that can lower the Heat Affected Zone (HAZ) of the process and lower heat diffusion cooling were found to be even more effective and less stress-inducing. Using a 700 psec 532 nm pulsed laser for example, effective lift-off was achieved using a fluence of 50-75 mJ/cm$^2$. This is about 5-6 times lower than using a 30-50 nsec laser pulse system.

Figure 9:
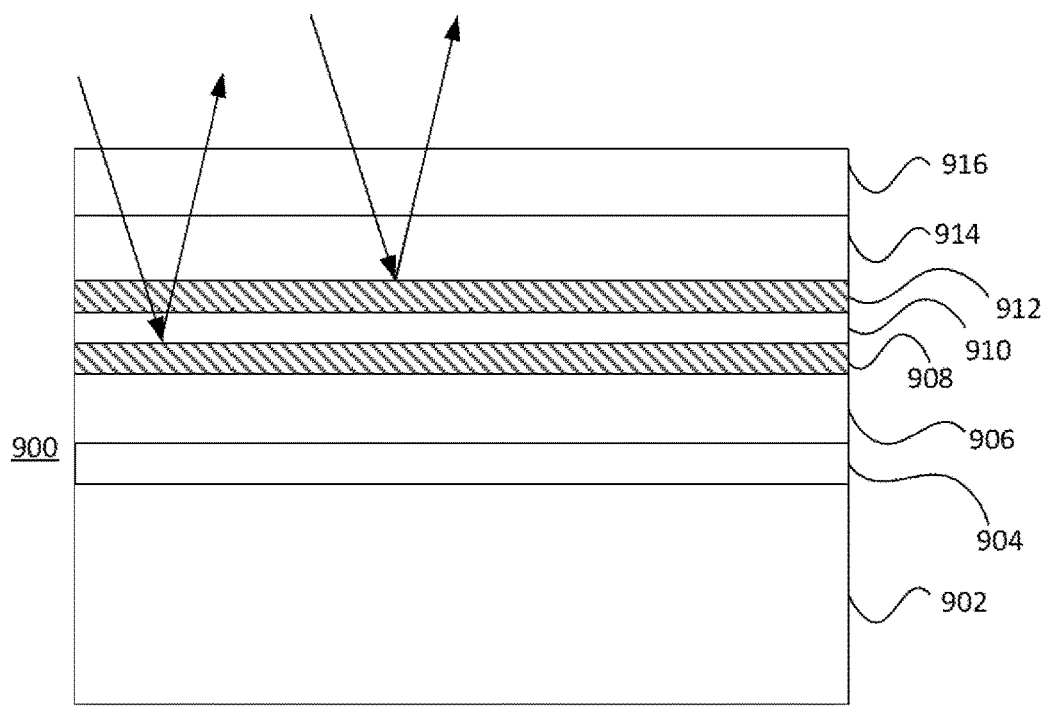
FIG. 9 is a simplified cross-sectional view of a structure incorporating a reflecting layer.

A reflector layer may be fabricated as part of the structure. FIG. 9 shows an embodiment of a structure 900 featuring a substrate 902, a glass layer 916, and a reflector layer interposed somewhere between the InN light absorption layer 914 and the GaN layer 906 bonded to the substrate by an oxide layer 904.

Aluminum, for example, can be deposited as a layer away from the glass/InN system that can act as a reflector, returning the light back onto the InN layer after passing through it. Integrating this reflector layer can serve to better control the application of light energy impinging on the InN layer. In one example, a reflector layer 912 can be inserted between the solder or oxide bond layer 910. If the bond layer is oxide, the reflector layer 908 can also be inserted between the oxide bond layer 910 and the GaN layer 906.

Other first release steps are possible other than using implantation-induced thermal cleaving. One is using an epitaxially grown laser-induced release layer (with an overlying film to be released) while another is an implant layer that has enough absorption to release the overlying layer using a laser beam with a fast pulse characteristic such as a Q-switched 532 nm picosecond/nanosecond laser system.

An epitaxially grown first release step embodiment is described next. Specifically, incorporated by reference in its entirety herein for all purposes, is the following paper by Iida et al., "Laser lift-off technique for freestanding GaN substrate using an In droplet formed by thermal decomposition of GaInN and its application to light-emitting diodes", Applied Physics Letters 105, 072101 (2014). That reference describes the thermal decomposition of GaInN composites, which can allow release of materials. Such a bond-and-release system is employed in the alternative process flow embodiment shown and described below in connection with FIGS. 5 and 6.

Yet another first release step combines the laser lift-off (LLO) process with an implant layer. Recognizing that hydrogen implant in GaN forms enhanced absorption regions at the end-of-range (EOR) of the implant layer, an appropriate laser process can be used to decompose the implanted region which can allow release of materials. Such a bond-and-release system is employed in the alternative process flow embodiment shown and described below in connection with FIGS. 7 and 8. The type of laser is preferably a 532 nm doubled-YAG laser type that can generate a high intensity, small duration light pulse of light within the wavelength spectrum that shows enhanced absorption. Other laser systems such as a 355 nm tripled-YAG laser that has a strong absorption contrast compared to the GaN material outside of the EOR can also be utilized.

While the particular embodiment shown in FIGS. 3-3B is a functional one, issues may still arise regarding mismatch in CTE between a substrate and the overlying GaN layer. Also, the global application of thermal energy according to a TLO scheme may impact the available thermal budget of the process.

Figure 4:
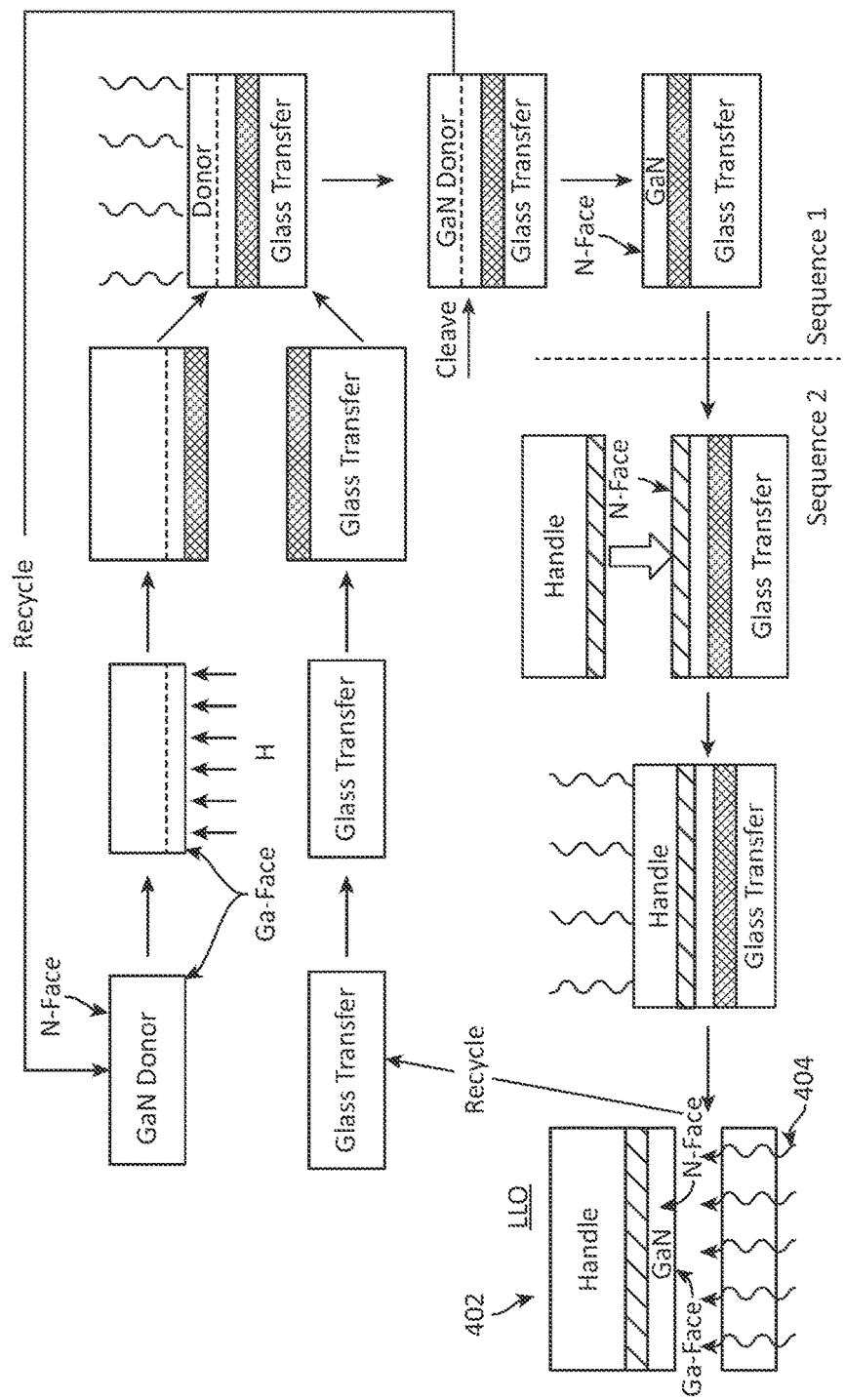
FIG. 4 shows an overview of a third exemplary process according to an embodiment.

Accordingly, FIG. 4 shows an overview of a third exemplary process of an embodiment. Similar to the process of FIGS. 3-3A, this process flow involves two bond-and-release sequences. However the process flow of FIG. 4 utilizes a glass transfer substrate, with two specific implications. First, CTE of the glass substrate can be selected to be better matched with the GaN, thereby reducing stress and improving quality of the crystalline structure. Such a better CTE-matched glass is type AF-45 glass made by Schott AG (Jena, Germany). This glass has a CTE of about 4.5 ppm/° C. and is well matched with GaN CTE (orthogonal to the c-plane) when bonded at room temperature to about 425° C. Second, the glass transfer substrate is transparent to a radiation spectrum from about 350 nm to over 1000 nm, allowing the local application of thermal energy through the glass substrate in a precise manner from a suitable laser beam wavelength such as a 532 nm doubled YAG laser—a Laser Lift Off (LLO) release mechanism.

Specifically, the process flow of FIG. 4 is similar to that shown in FIG. 3, except that in the second release phase 402, energy is applied locally through the glass transfer substrate to heat the solder, by an energetic beam 404. This beam may be applied in a time-varying manner (e.g., pulsed), and/or applied in a spatially varying manner (e.g., by scanning and/or shaping) in order to achieve energy delivery in a desired manner.

Figure 4A:
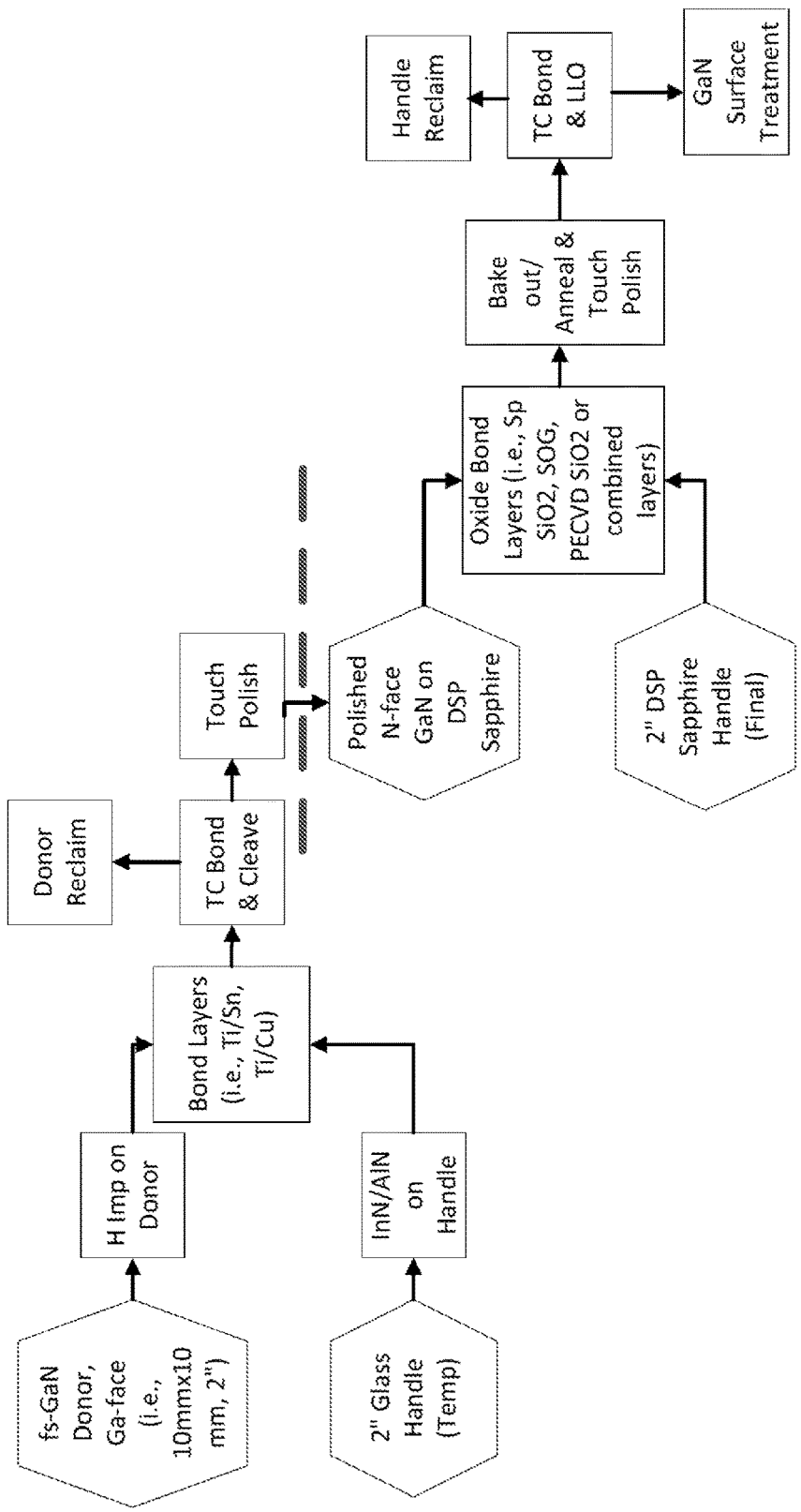
FIG. 4A is a simplified diagram summarizing the process flow according to the embodiment of FIG. 4.

FIG. 4A is a simplified diagram summarizing the process flow according to the embodiment of FIG. 4.

The above sequence of steps provide a method according to certain embodiments of the present invention. Other alternatives can also be provided where steps may be added, one or more steps may be removed, or one or more steps may be provided in a different sequence without departing from the scope of the claims herein.

While the particular embodiment shown in FIGS. 4-4A is functional, the implantation of particles as part of a bond-and-release sequence can contribute complexity and add expense in the form of an accelerator apparatus.

Figure 5:
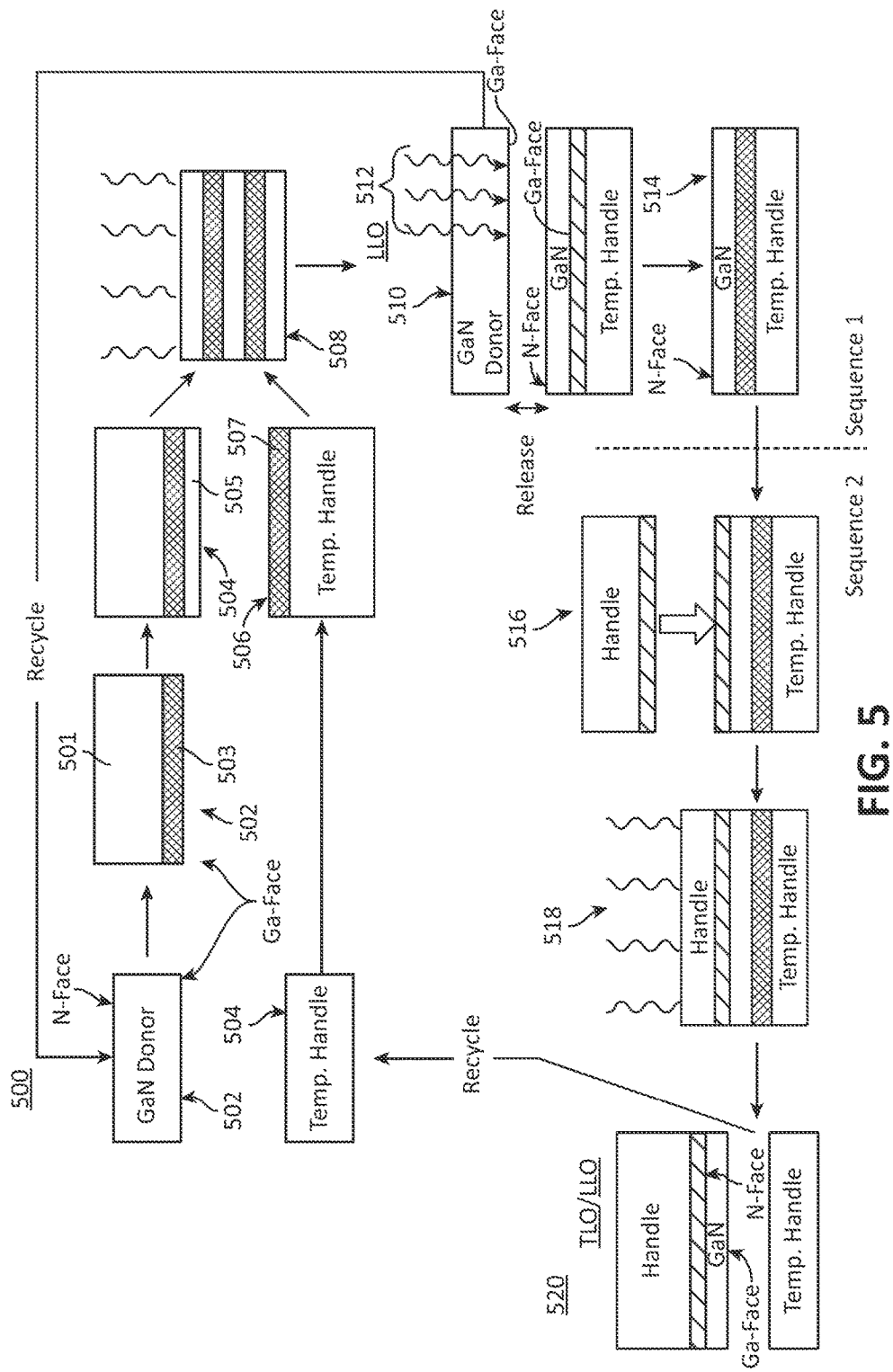
FIG. 5 shows an overview of a fourth exemplary process according to an embodiment.

Accordingly, FIG. 5 shows an overview of a fourth exemplary process flow 500 of an embodiment. The release stage of the first bond-and-release sequence of this embodiment, utilizes a thermal decomposition characteristic of a component, rather than a cleaving approach.

Specifically, step 502 comprises forming a heteroepitaxial super lattice 503 over a GaN donor 501. This super lattice is grown by metallo-organic chemical vapor deposition (MOCVD), and includes a GaInN composite. In certain embodiments this composite may comprise $Ga_{0.85}In_{0.15}N$.

Step 504 then comprises epitaxial growth of a GaN layer 505 over the super lattice.

Step 506 comprises forming an InN/AlN layer 507 on the surface of a temporary handle substrate, e.g., comprising sapphire or glass. This InN/AlN layer may be formed by sputtering.

Step 508 shows the next step, wherein the epitaxial GaN layer of the donor surface, is placed into contact with the InN/AlN layer on the temporary donor in conjunction with the application of thermal energy. This results in bonding of the donor to the temporary handle.

FIG. 5 shows the next step 510, wherein energy in the form of a beam 512 is applied through the GaN donor to the super lattice, resulting in thermal decomposition thereof into indium in liquid droplet form. The resulting release produces an intermediate structure 514 comprising the temporary handle substrate bearing the epitaxially grown GaN layer.

The second bond-and-release sequence commences with step 516, wherein oxide is formed over both exposed surfaces of a handle substrate 518 and the intermediate structure. This oxide may be applied in the form of SOG, CVD oxide, sputtering and/or other forms.

In step 518, the oxide surfaces are placed into contact and then bonded. Step 520 shows the release phase of the second bond-and-release sequence, wherein thermal decomposition of the InN/AlN layer results in the formation of indium droplets and nitrogen gas, such that the GaN layer remains bonded to the handle via the intervening oxide. This second release may take place utilizing TLO or LLO approaches. Once released, the temporary handle substrate may then be recycled for use in another layer transfer process as shown.

Figure 5A:
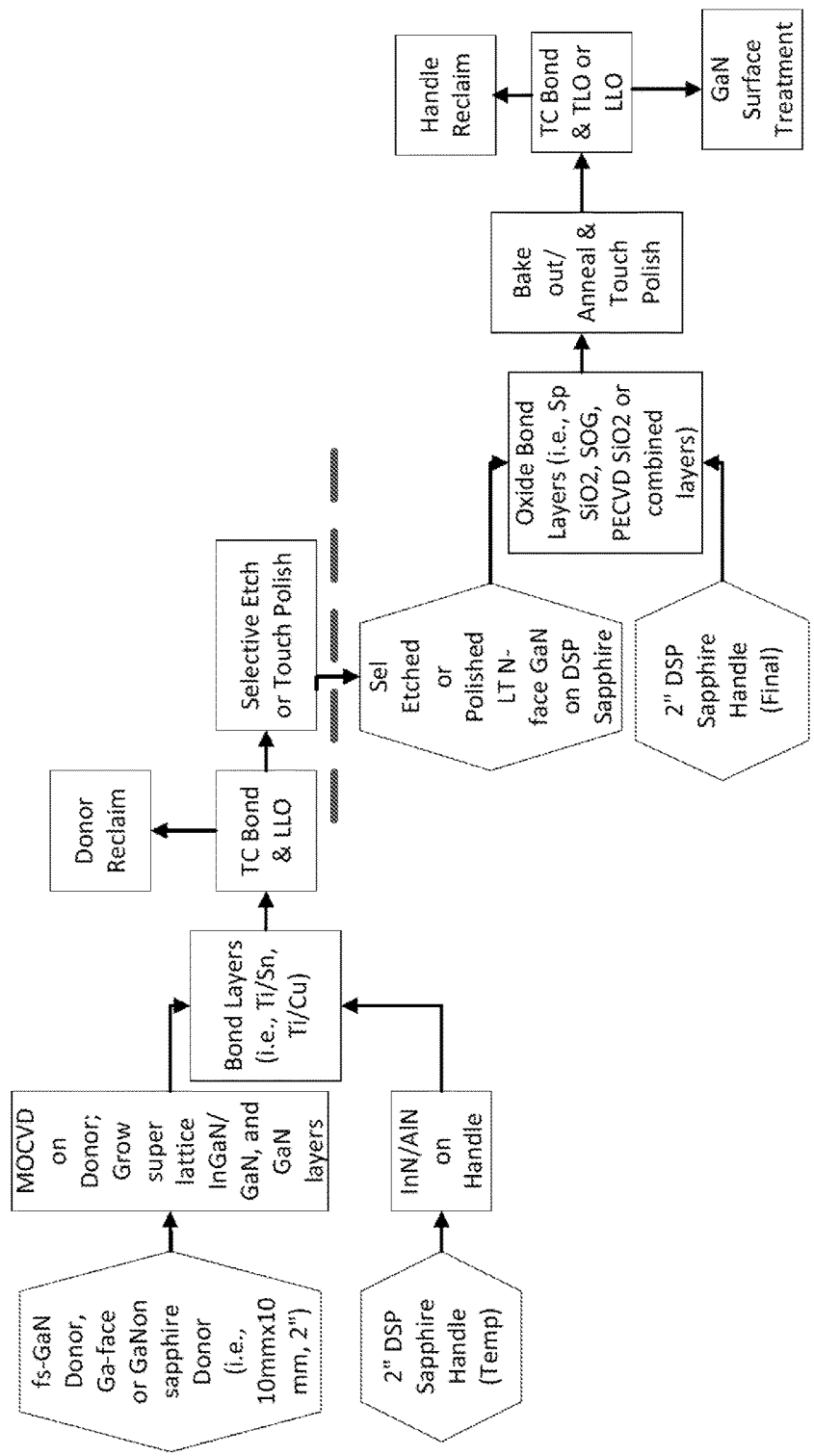
FIG. 5A is a simplified diagram summarizing the process flow according to the embodiment of FIG. 5.

FIG. 5A is a simplified diagram summarizing the process flow according to the embodiment of FIG. 5.

The above sequence of steps provide a method according to certain embodiments of the present invention. Other alternatives can also be provided where steps may be added, one or more steps may be removed, or one or more steps may be provided in a different sequence without departing from the scope of the claims herein.

While the particular embodiment shown in FIGS. 5-5A is functional, the utilization of two (2) bond-and-release sequences contributes additional process steps that can diminish throughput and increase cost.

Figure 6:
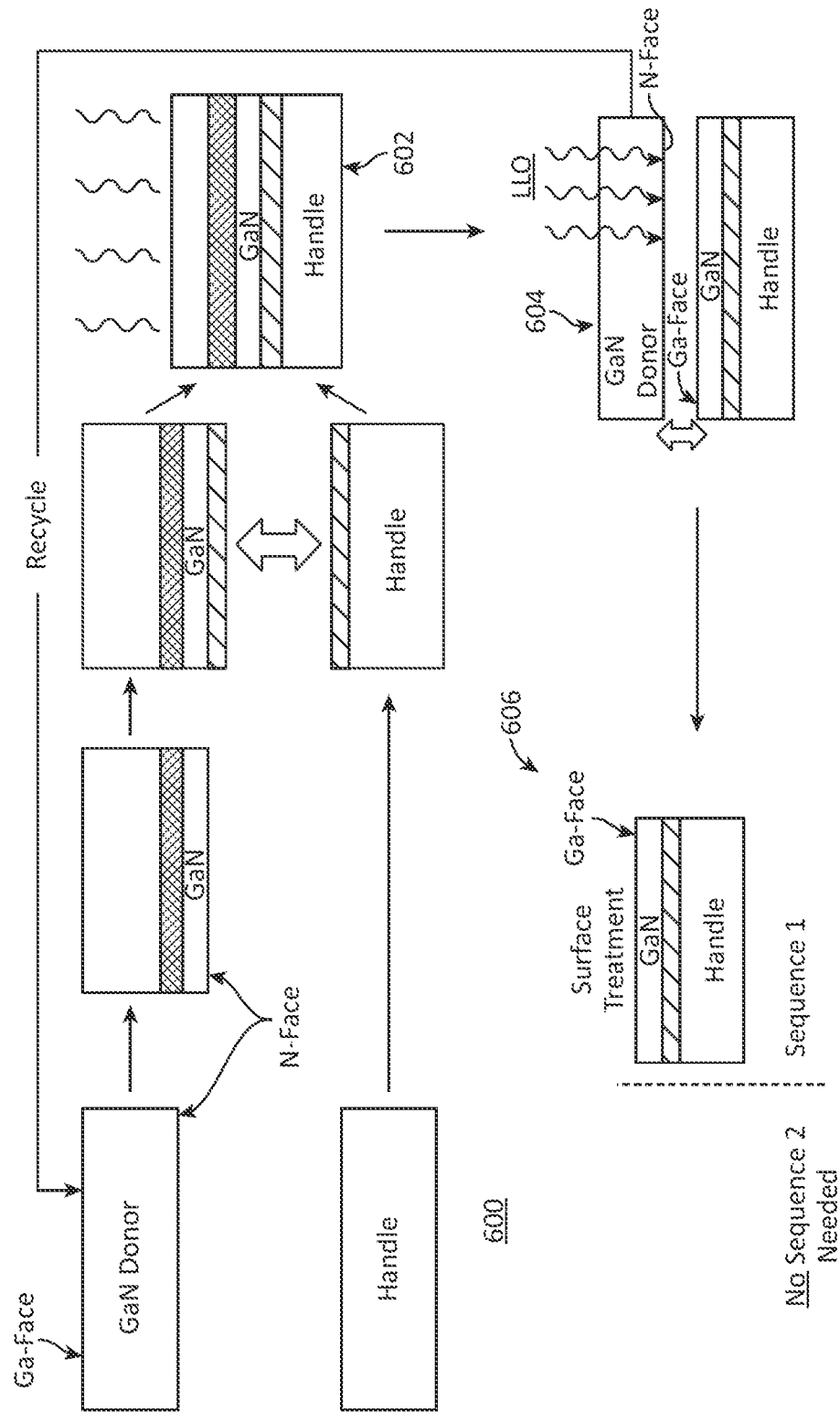
FIG. 6 shows an overview of a fifth exemplary process according to an embodiment.

Accordingly, FIG. 6 shows an overview of a fifth exemplary process flow 600 according to an embodiment. Specifically, the single bond-and-release sequence of this process comprises the formation of oxide (e.g., spun on and/or deposited as described above) on the surface of both a handle substrate and a donor comprising an epitaxial GaN layer grown over an In-containing super lattice structure.

Following bonding in step 602, application of a localized energy beam through the GaN donor in step 604 allows release via the thermal decomposition into liquid indium. This results in step 606, of the epitaxial GaN remaining bonded to the handle via the intervening oxide layer. Surface treatment of the Ga-Face released by this process (e.g., polishing), can reduce its roughness.

Figure 6A:
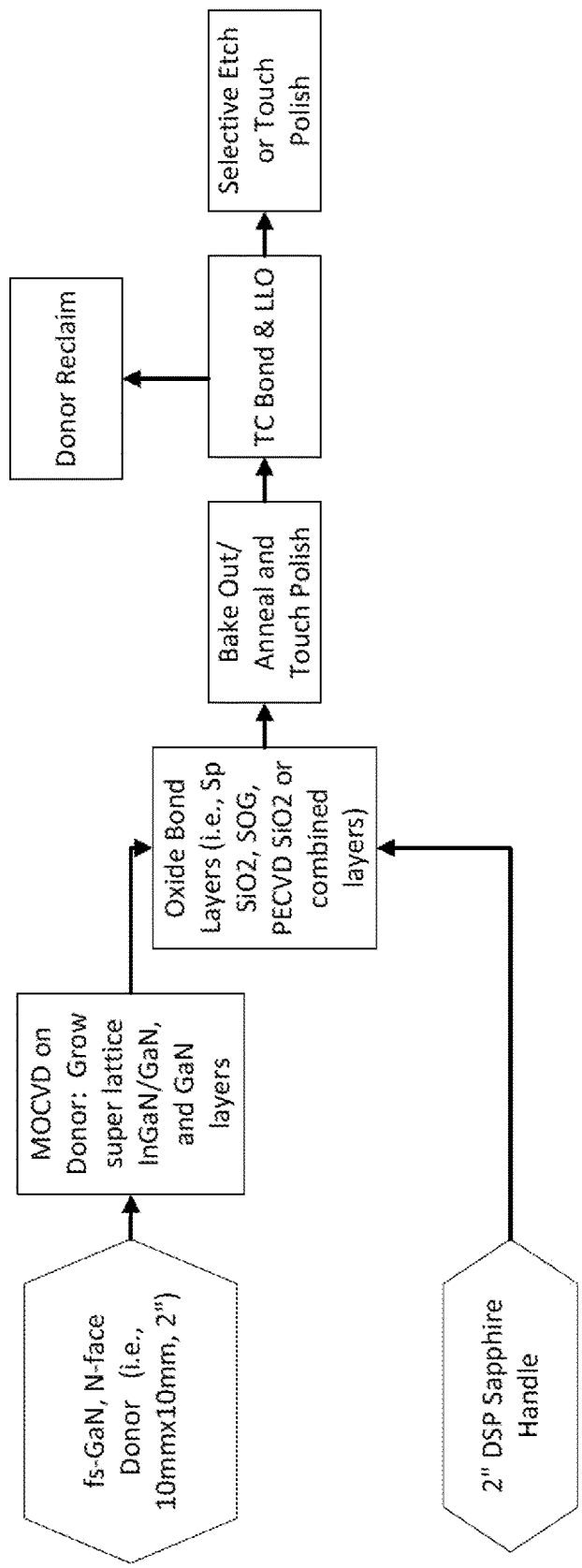
FIG. 6A is a simplified diagram summarizing the process flow according to the embodiment of FIG. 6.

FIG. 6A is a simplified diagram summarizing the process flow according to the embodiment of FIG. 6.

Figure 7:
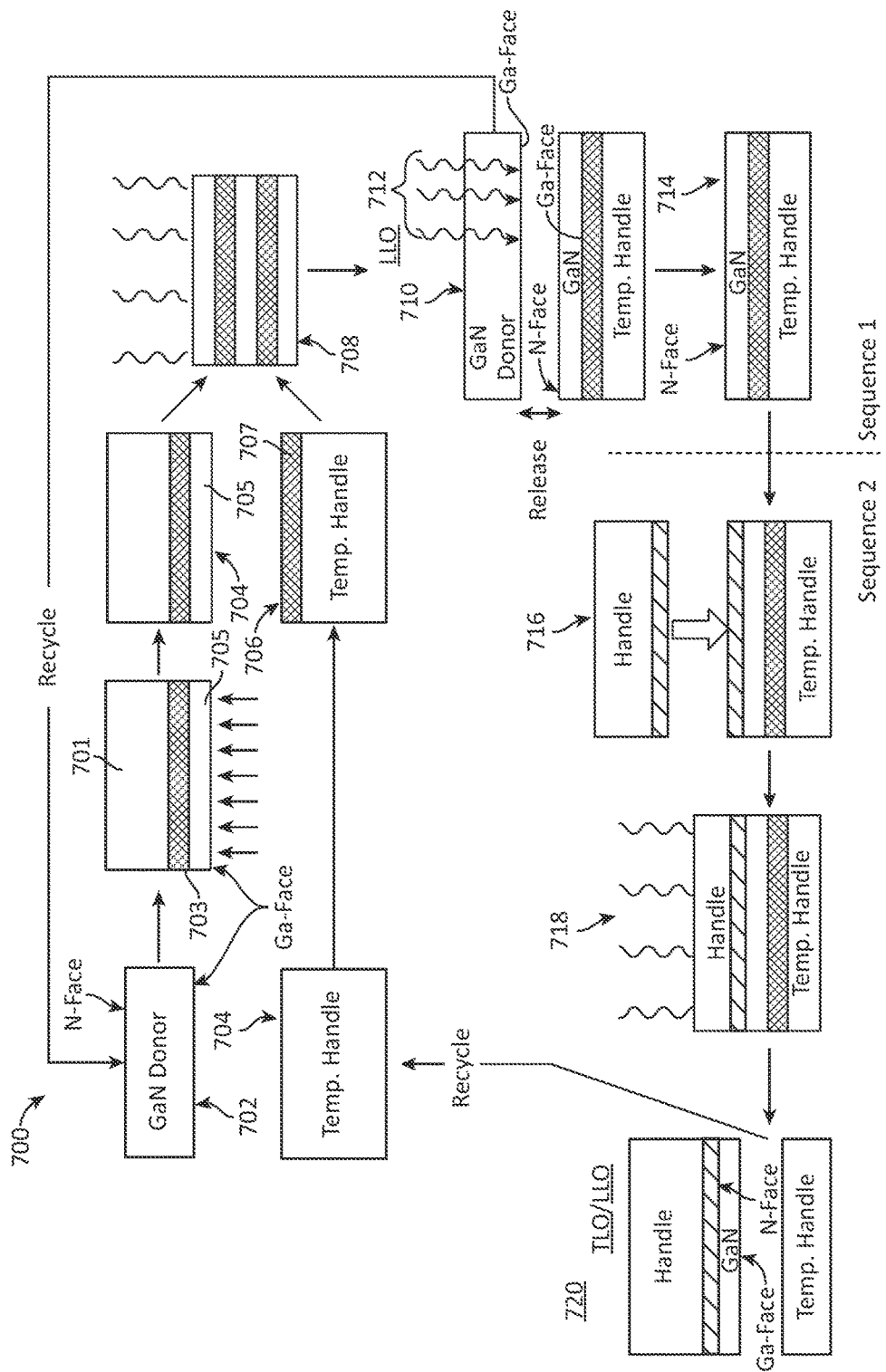
FIG. 7 shows an overview of a sixth exemplary process according to an embodiment.

FIG. 7 shows an overview of a sixth exemplary process flow 700 of an embodiment. The release stage of the first bond-and-release sequence of this embodiment, utilizes a laser-induced thermal decomposition characteristic of an implanted layer, rather than a cleaving approach.

Specifically, step 702 comprises forming an implanted layer 703 within a GaN donor 701 with an overlying GaN layer 705 over the implant layer. This implant layer has enhanced absorption characteristics that interact with a laser pulse to cause the GaN in the vicinity of the implant end-of-range (EOR) to decompose and release the overlying GaN layer. The modification of light absorption within GaN is characterized in B S Li and Z G Wang "Structures and optical properties of $H_2$-implanted GaN epi-layers", J. Phys. D: Appl. Phys. 48 (2015) 225101, which is incorporated by reference herein for all purposes. This study includes implant-induced absorption as a function of implant dose and temperature. In one experiment, a 430 um GaN-on-Sapphire substrate was implanted with hydrogen at a dose of 3.5e17 $H+/cm^2$ (implant energy was 75 keV) and subsequently coated with 330 nm of oxide. The absorption at 532 nm increased from 3% to 50%. Assuming an EOR layer as approximately 0.16 um, the EOR layer absorption coefficient is about 5e4 $cm^{-1}$. This layer was shown to strongly interact with a 532 nm laser pulse to cause EOR layer disassociation with both backside or frontside illumination. The experiments were made using a laser scanning/marking system (532 nm SHG PowerLine Pico with a RS-10 scanner coupled to a 255 mm f-theta lens via a 1.5× beam expander) manufactured by Rofin-SINAR Technologies (Plymouth, Mich. USA/Hamburg, Germany). The system produced a spot size of approximately 60 um with an average power of 3 Watts at 400 HKz. The system was effective in showing film detachment of the GaN overlying film on the GaN-on-Sapphire sample at the expected depth of approximately 850 nm using 3-5 microjoule pulses at 200-400 KHz repetition rate at a scan speed between 2000-8000 mm/sec. Such a strong interaction can provide significant cost and productivity advantages by allowing lower implant doses effective for layer transfer, lower than doses required for thermal cleaving or controlled-cleave processes.

Step 704 then comprises providing the implanted GaN layer 705.

Step 706 comprises forming an InN/AlN layer 707 on the surface of a temporary handle substrate, e.g., comprising sapphire or glass. This InN/AlN layer may be formed by sputtering.

Step 708 shows the next step, wherein the implanted GaN layer of the donor surface, is placed into contact with the InN/AlN layer on the temporary donor in conjunction with the application of thermal energy. This results in bonding of the donor to the temporary handle. The surfaces 704 and 706 can also have a bond promoting layer such as silicon dioxide formed on the surfaces if desired.

FIG. 7 shows the next step 710, wherein energy in the form of a beam 712 is applied through the GaN donor to the implant layer, resulting in thermal decomposition thereof into Gallium and Nitrogen. The resulting release produces an intermediate structure 714 comprising the temporary handle substrate bearing the overlying GaN layer.

The second bond-and-release sequence commences with step 716, wherein oxide is formed over both exposed surfaces of a handle substrate 718 and the intermediate structure. This oxide may be applied in the form of SOG, CVD oxide, sputtering and/or other forms.

In step 718, the oxide surfaces are placed into contact and then bonded. Step 720 shows the release phase of the second bond-and-release sequence, wherein thermal decomposition of the InN/AlN layer results in the formation of indium droplets and nitrogen gas, such that the GaN layer remains bonded to the handle via the intervening oxide. This second release may take place utilizing TLO or LLO approaches. Once released, the temporary handle substrate may then be recycled for use in another layer transfer process as shown.

Figure 7A:
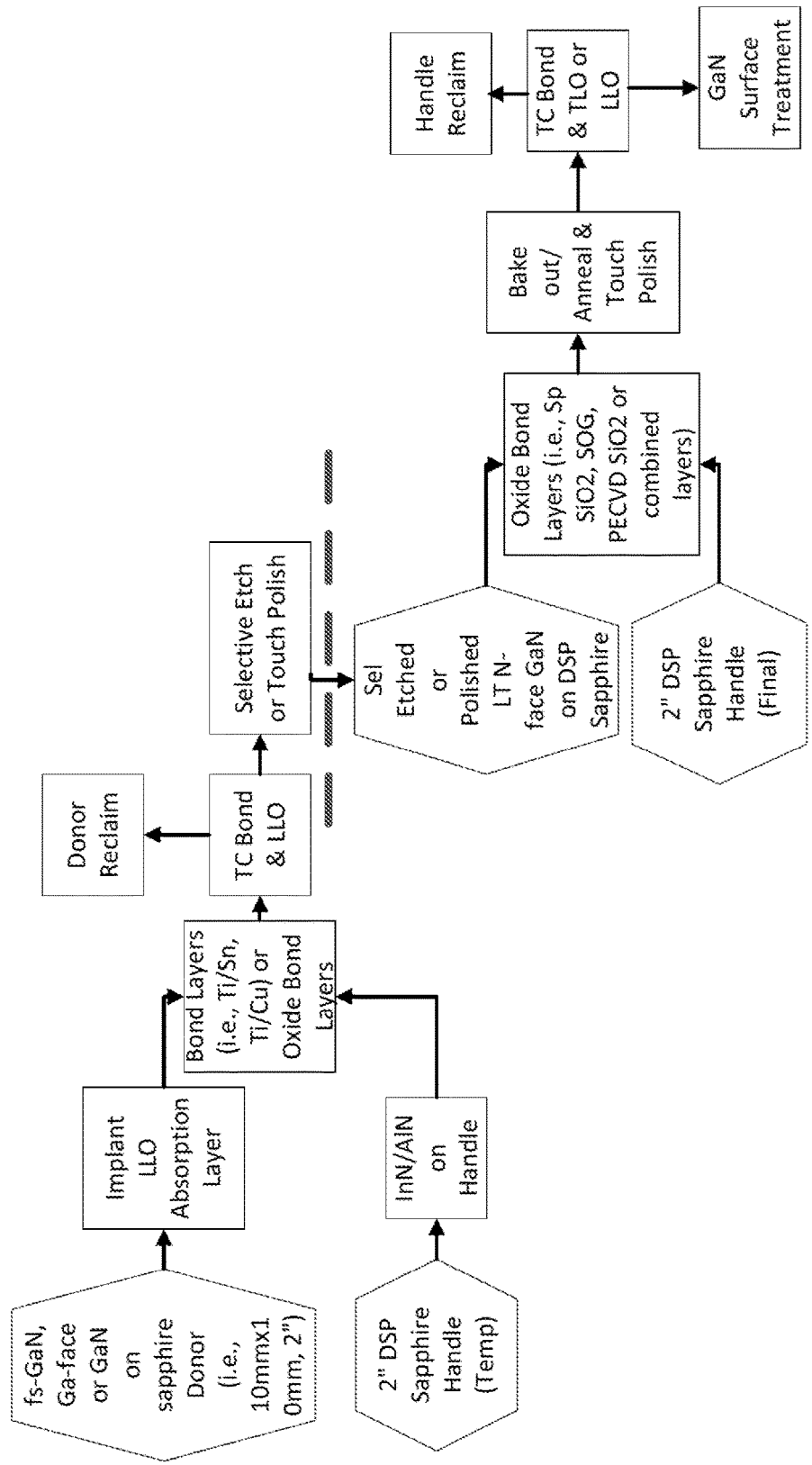
FIG. 7A is a simplified diagram summarizing the process flow according to the embodiment of FIG. 7.

FIG. 7A is a simplified diagram summarizing the process flow according to the embodiment of FIG. 7.

The above sequence of steps provide a method according to certain embodiments of the present invention. Other alternatives can also be provided where steps may be added, one or more steps may be removed, or one or more steps may be provided in a different sequence without departing from the scope of the claims herein.

While the particular embodiment shown in FIGS. 7-7A is functional, the utilization of two (2) bond-and-release sequences contributes additional process steps that can diminish throughput and increase cost.

Figure 8:
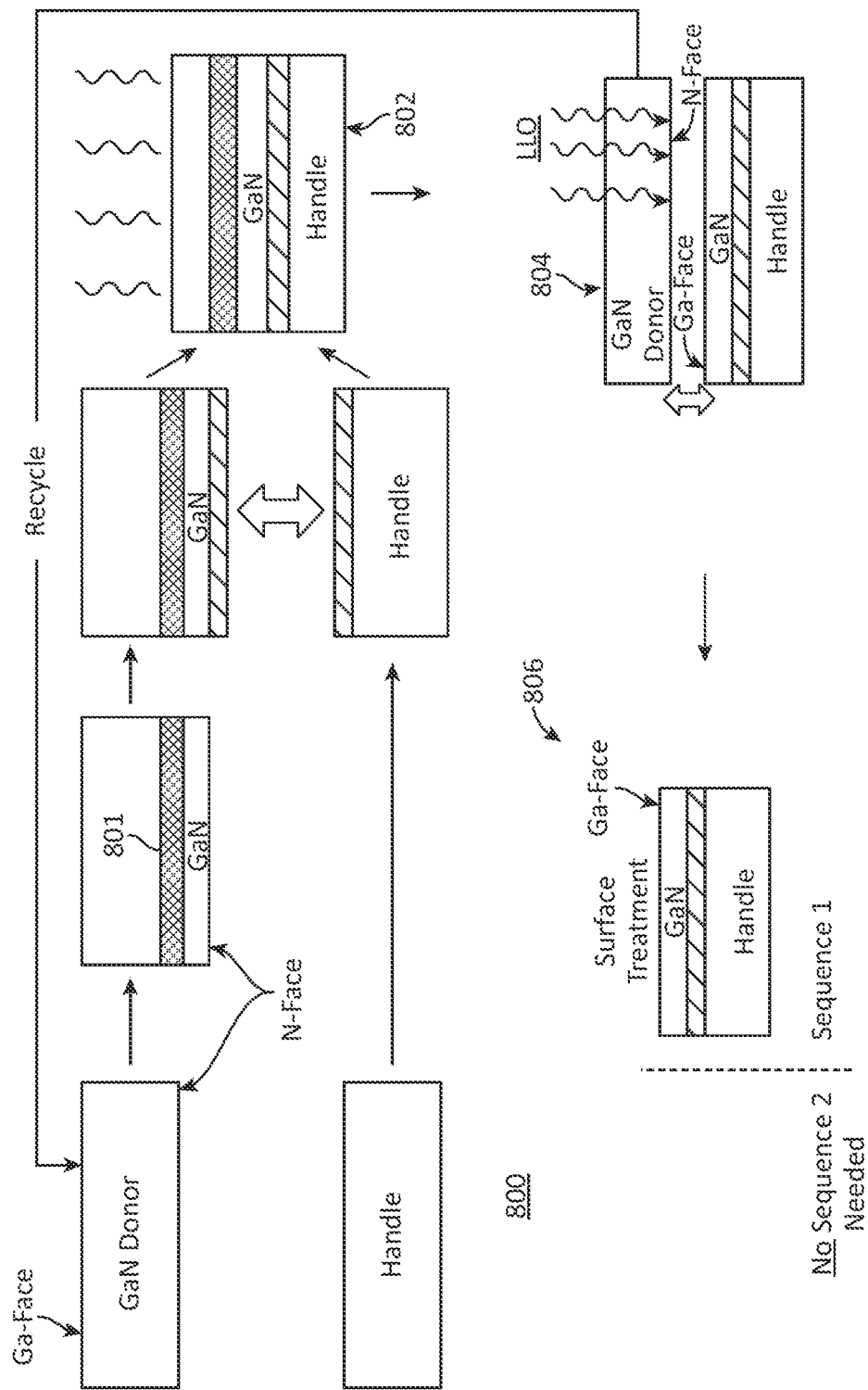
FIG. 8 shows an overview of a seventh exemplary process according to an embodiment.

FIG. 8 shows an overview of a seventh exemplary process flow 800 according to an embodiment. Specifically, the single bond-and-release sequence of this process comprises the formation of oxide (e.g., spun on and/or deposited as described above) on the surface of both a handle substrate and a donor comprising a GaN layer overlying an implant LLO absorption region 801.

Following bonding in step 802, application of a localized energy beam through the GaN donor in step 804 allows release via the laser-induced decomposition into Gallium and Nitrogen. This results in step 806, of the overlying GaN film remaining bonded to the handle via the intervening oxide layer. Surface treatment of the Ga-Face released by this process (e.g., polishing, RIE), can reduce its roughness.

Figure 8A:
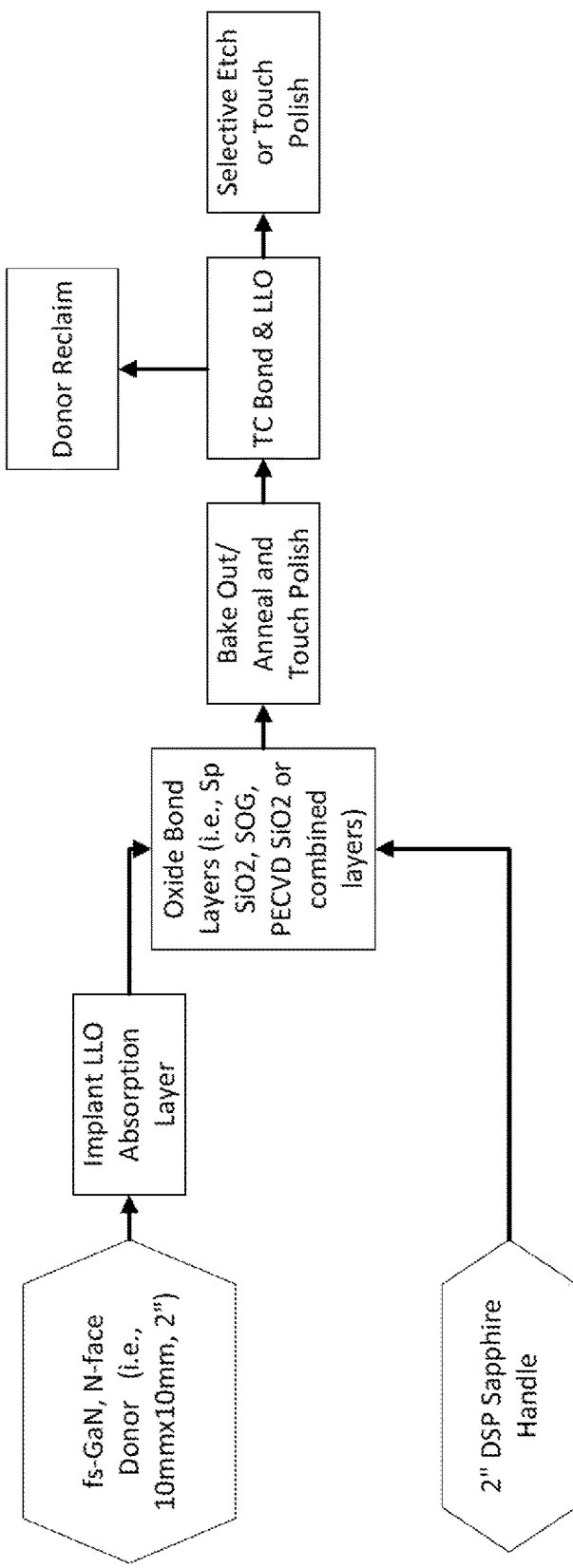
FIG. 8A is a simplified diagram summarizing the process flow according to the embodiment of FIG. 8.

FIG. 8A is a simplified diagram summarizing the process flow according to the embodiment of FIG. 8.

Methods according to embodiments of the invention can be used in a variety of applications. Examples include but are not limited to LED, optoelectronic devices, semiconductor device packaging, semiconductor devices, photovoltaic cells, MEMS devices, and others.

According to certain embodiments, a free standing film may be separated from a bulk material. In one embodiment, a free standing layer of semiconductor material such as single crystal GaN, having a thickness of 10 µm or greater, may be cleaved from a bulk ingot utilizing high energy implantation. Cleaving the ingot in this manner substantially reduces the amount of semiconductor material that is otherwise lost to the kerf in a conventional blade cutting process. In addition to enhancing the efficiency of the cleave action, managing parameters such as ion dose and temperature profile is also important to limit and control the radiation damage to the material that is separated. The resulting cleaved free standing film may be particularly suited for use in illumination, for example LEDs or laser devices.

For purposes of the following disclosure, a "free standing film" or "free standing layer" is defined as a film of material that can maintain its structural integrity (i.e. not crumble or break apart), without being in contact with a supporting member such as a handle or transfer substrate. Typically, very thin films (for example GaN films thinner than about 5-10 µm) are unable to be handled without breaking. Conventionally, such thin films are manipulated using a supporting structure, which may also be needed to create the thin film in the first place. Handling of thicker films (i.e. GaN films having a thickness of between 10-50 µm) may be facilitated by the use of a support, but such a support is not mandatory. Accordingly embodiments of the present invention relate the fabrication of free standing films having a thickness of greater than 10 Also for purposes of the following disclosure, the terms "substrate" and "tile" are employed interchangeably.

Embodiments in accordance with the present invention are not limited to forming free standing films. Alternative embodiments may involve the formation of films supported by a substrate. Moreover, irrespective of whether the films used in various applications are truly free-standing or supported with handling or transfer substrates during processing, processed devices are usually mounted onto a mechanical interface such as a metal base for the final application as an integral part of a lighting module.

Also for purposes of the following disclosure, "bulk material" refers to a material present in bulk form. Examples of such bulk material include a substantially circular ingot or boule of single crystal GaN as grown, or a grown single crystal GaN ingot having sides shaved to exhibit other than a substantially circular cross-sectional profile. Still other examples of bulk materials are described below.

In a specific embodiment, the present method may be applied successively to transfer multiple layers from a single ingot, e.g., GaN boule or a thickness of GaN mounted onto a suitable substrate such as a metal base substrate. That is, the method can be repeated to successively cleave slices (similar to cutting slices of bread from a baked loaf) according to a specific embodiment. Of course, there can be other variations, modifications, and alternatives.

As mentioned previously, various surface treatment processes may be employed at one or more stages. According to certain embodiments, the exposed surface of material grown or released from a substrate is polished to reduce roughness resulting from any cleaving process. The combination of the polished cleaved material and the underlying substrate may then be transferred as an added value material for further processing and incorporation into an optoelectronic device.

While the above description references surface treatment utilizing polishing, this is not required in all embodiments, and alternatives could employ polishing in combination with other surface treatment, or even surface treatment that does not involve polishing. For example, according to some embodiments the surface treatment could include an anneal. In particular embodiments the anneal could take place in the presence of an overlying cap layer, for example comprising AN or SiO2. The annealing could be performed in a furnace (e.g. typically where the cap layer is present), or could be performed within a MOCVD chamber (e.g. where no cap layer is present).

Surface treatment (e.g. comprising polishing, annealing, and/or cap layer formation) could also include etching processes. Examples of etching processes can include but are not limited to plasma etching, and/or chemical etching. Chemical assisted ion beam etching (CAIBE) is one example of a type of chemical etching. Wet chemical etching is another example of chemical etching.

The above sequence of steps provide a method according to certain embodiments of the present invention. Other alternatives can also be provided where steps may be added, one or more steps may be removed, or one or more steps may be provided in a different sequence. For example in an alternative embodiment, substrate bonding could take place after the cleaving, with the cleaving resulting in a free standing film in turn bonded to the substrate.

No specific crystal orientation is required of the material of the donor substrate. Thus a donor comprising a GaN ingot may exhibit one of the typical crystalline orientations, for example (0001).

As mentioned above, materials utilized during a layer transfer process may be specifically selected according to their properties, including their thermal properties. Thus substrates and/or layers may comprise material(s) having a coefficient of thermal expansion (CTE) compatible with conditions expected to be encountered during the process. For example, the linear coefficient of thermal expansion of GaN ($\alpha_{GaN}$) is about $5.5 \times 10^{-6}$ $K^{-1}$.

Examples of such materials having CTE compatibility with GaN may include certain glasses. Other examples of materials having CTE compatibility with GaN can include but are not limited to, metal or metal alloys. Possible suitable metals may include Molybdenum or Tungsten, while candidate metal alloys may comprise molybdenum, such as copper molybdenum alloys or molybdenum tungsten alloys.

Other materials which can be used as a temporary and/or permanent handle include dielectric materials such as aluminum nitride (AlN) or mullite ($Al_2O_3$:$SiO_2$). These materials can be made to have a CTE value close to GaN and both have the requisite thermal and chemical robustness necessary to function as a mechanical substrate for the GaN film within the MOCVD growth environment.

Embodiments are not specifically limited to particular materials mentioned so far. Examples of various layers which may be used can include barrier layers, thermo-compression bond layers, a mirror layer, and the GaN buffer and device growth layers. Barrier layers are layers that protect the integrated films from contamination, inter-mixing and other deleterious effects during thermal processing such as the GaN device layer formation step(s). Such layers can include AlN, HfN, TiB2, Pt, Ta among other well known barrier layer materials. Other such layers serving as encapsulation layers may also be desirable to enhance surface properties such as porosity and roughness. For example, a nickel layer (polished or not depending on the specific application) may serve as an encapsulating layer on a Molybdenum alloy substrate to provide good bond yield and uniform surface characteristics. Other coating layers can include but are not limited to nickel-gold alloys, ruthenium, chromium or silver.

Subsequent steps to grow the devices from the GaN layer (e.g., in FIG. 1B) may involve metal-organic chemical vapor deposition (MOCVD) of GaN at roughly 1000° C. for 2-3 hours. Accordingly, the use of appropriate buffer and/or barrier layers may ensure thermal survivability of desired features.

Together, the layers form an engineered GaN growth substrate, and may achieve one or more of the following possible features and potential benefits for the HB-LED device manufacturers.

One possible benefit is a reduction in lattice mismatch. In particular, this benefit may be achieved by using a thin, high-quality GaN layer for epitaxial growth.

Another possible benefit is a low incidence of threading dislocation density (TDD)/Defects. According to embodiments, these defects may be reduced to at or below Free Standing GaN levels, using a thin, high-quality GaN layer.

Still another possible benefit is a reduction in CTE-Mismatch. Use of a CTE-matched substrate engineered to match the GaN layer through the epitaxial growth temperature, may thereby eliminate CTE mismatch induced layer stresses, cracks and defects. Lower CTE-mismatch and/or the lack of a buffer layer that is present when GaN is heteroepitaxially grown (such as GaN over sapphire for example) could also allow thicker GaN films to be deposited crack-free. This in turn could allow for thicker contact GaN layer(s) (e.g., doped) to be fabricated crack-free that can lower sheet resistance and improve current spreading.

Yet another possible benefit is the realization of high electrical and thermal conductivity. The use of a metal substrate and thermally and electrically conductive internal layers, may allow the growth substrate to be used as the mounting substrate for the HB-LED package/luminaire in the final vertical LED structure. High thermal and electrical conductivity allows higher External Quantum Efficiency (EQE), higher Wall Plug Efficiency (WPE), and may eliminate certain back-end manufacturing steps. Proposed embodiments may allow vertical LED contact structure with desired thermal conductivity of the multi-stack substrate exceeding 5-30 W/cm$^2$-K, and electrical resistance of the multi-stack substrate (related to the electrical conductivity) may be less than $1 \times 10^{-4}$ Ohm-cm$^2$.

Embodiments may offer a possible benefit of enhanced optical efficiency. In particular, the integration of an internal reflector under the GaN growth film, may allow the use of the substrate within the final HB-LED package, with further savings in back-end manufacturing steps such as mirror layer growth and lift-off/bond steps. A reflection layer can comprise a metal such as silver, gold, aluminum. Use of a thin silver layer, for example, could support a reflectivity exceeding 75% in the 400-500 nm spectral range, which may be a desirable feature to achieve high external quantum efficiency. If a dielectric permanent handle substrate is used (made from sapphire, aluminum nitride (AlN) or mullite ($Al_2O_3$:$SiO_2$) for example), vertical device structures are possible if a conductive layer and optical reflector are deposited or otherwise fabricated between the handle substrate and the GaN film. Light scattering and high reflectivity will enhance light extraction efficiency while the electrically conductive layer would allow vertical bottom contact structures.

The reflection layer can comprise a dielectric layer stack. Such a dielectric layer stack may be made electrical conductive, in a manner that balances conductivity with reflective properties. Examples of parameters which can be controlled to form a dielectric layer stack exhibiting the desired properties can include but are not limited to, a number of layers in the stack, a thickness of layers in the stack, specific materials included in the stack, and/or the presence of dopant(s).

Still another potential benefit is the ability to enhance side light extraction from individual LED die through integrating features within the permanent handle substrate or the intervening layers with the GaN film close or at the edge of the die which is singulated as part of the LED manufacturing process after GaN device fabrication. For example, features that collect and redirect light from each LED die area can be made by patterning features that collect and redirect light within the permanent handle substrate near the die-die areas. Patterning a reflection material using etch and fill deposition in the areas between individual die separation areas is one example to accomplish side light reflection/extraction.

Still another possible benefit is the ability to use a smaller device size. Embodiments may offer a low droop and thus efficient devices can be operated at higher current density. With up to 10× or even more devices able to be made on a substrate, epitaxial and packaging costs can be substantially lowered.

Embodiments may also be employed for GaN-based electronic devices. In such embodiments, the layers can be modified with a thermally conductive, electrically insulating intervening layer below the GaN device layer. In a particular embodiment, the integrated mirror layer of an LED embodiment could be substituted with a thin (e.g. 20-50 um) insulating layer that would allow good GaN electronic device operation but also allow good thermal heat transfer. Such an intervening layer can be a material having good thermal conductivity and high electrical resistivity. Depending on the desired performance and cost targets, materials such as AlN (Aluminum Nitride) and Sapphire can be suitable.

One key application of the layer-transfer technology, may be to fabricate a functionally equivalent substrate to a free-standing GaN wafer for HB-LED and laser diode device manufacturing. Possible commercial advantages achieved in using free-standing GaN may include but are not limited to (i) better HB-LED performance (up to 100% higher in lumens/watt) and (ii) lower cost of epitaxial device layer manufacturing due to 30-50% less epitaxial growth chamber time by the elimination of graded buffers. In addition, the more efficient device offers substantial savings in packaging as well as competitive differentiation.

The use of conventional free-standing GaN substrates in device manufacturing is currently limited by cost and size limitation (e.g. 2" and 4" diameters presently). Both of these limitations are considered fundamental and strongly linked to the present methods of manufacturing GaN crystals by hydride vapor phase epitaxy (HVPE) or ammonothermal (Ga or GaN in supercritical ammonia/mineralizer) growth approaches.

HVPE and ammonothermal growth methods are slow and costly. Higher quality GaN usually necessitates less than 100-200 microns per hour using HVPE Ammonothermal growth may be slower, but with somewhat better crystal quality.

As the GaN bulk crystal is grown conventionally, defects such as dislocations generally work themselves out of the crystal by edge termination. This strongly ties the crystal diameter to the rate of dislocation reduction, and hence the HVPE and ammonothermal growth methods are generally limited to small crystal diameters for making high-quality GaN. Defect levels achievable on commercially available bulk or free-standing GaN (FS-GaN) 2" substrates are about $10^4$-$10^6$ defects/cm$^2$.

Because of the slow growth rate and use of wiresaws to fabricate these substrates, FS-GaN prices are currently in the $1,000-$2,000 (2" wafer) and $3,000-$5,000 (4" wafer). Because of the high cost of these substrates, their use is limited to R&D (High-Electron Mobility Transistor (HEMT) and optoelectronic) as well as blue/UV laser diode manufacturing.

Although HB-LED device performance has been shown to improve as much as 100% using these higher quality substrates by eliminating the "droop effect", their high cost and limitation to small wafer diameters has prohibited their use. The use of high-quality GaN as a growth medium reduces or eliminates device "droop" (brightness efficiency drops with increasing current), a parasitic device characteristic that increases device area to achieve higher lumens/W efficiency and control areal power dissipation. The tailing off or droop of the emission power limits efficiency to about 100-120 lumens/watt for sapphire substrate-based devices but FS-GaN substrate HB-LED devices have been shown to yield over 200 lumens/watt.

This low-droop translates to an ability to increase the current density that in turn will lead to as much as a 10× reduction in the size of HB-LED devices fabricated on substrates utilizing high-quality GaN material according to embodiments.

Thus as indicated above, embodiments may benefit the HB-LED industry in numerous areas, including but not limited to cost, packaging, and reliability.

It is noted that certain embodiments previously described (e.g., in connection with FIGS. 2-4A) utilize implantation of particles to form a cleave region at a depth into the workpiece. In some embodiments, accelerated particles could be directed in a manner (e.g. energy) calculated to form a cleave region at or near an interface between additional material and an underlying workpiece. The presence of the implanted particles in a region at or near this interface, could ultimately reduce an amount of applied energy required to initiate and/or propagate cleaving in a cleave region located proximate to the interface.

And while the above description has focused upon forming an additional material on a workpiece comprising single crystal GaN to form a multi-layer structure, this is also not required. According to alternative embodiments, the additional material could be present on a workpiece. One example of such additional material is single-crystal SiC, (111) silicon, single-crystal and metal films where the material can serve as a seed layer for GaN heteroepitaxial growth.

It is further noted that the choice of material for both the workpiece and for the additional layer, can play a role in determining a character of the stress/strain experienced by the additional layer. For example, the choice of workpiece/additional layer may also determine a relative mismatch in coefficient in thermal expansion between them, which in turn can contribute to both the polarity and magnitude of stress/strain arising in the additional layer over a range of temperatures. In view of the above, the workpiece and/or the additional layer materials can be carefully selected to achieve a desired layer of stress/strain within the additional layer over various processing steps.

In specific embodiments, a silicon dioxide or AlN layer can be applied through sputtering or PECVD and optionally densified prior to an implant step. If a film or film stack is applied, it may be of limited total thickness to allow the implant at the selected energy to penetrate into the bulk at the desired cleave depth. Of course there can be other variations, modifications, and alternatives.

In accordance with particular embodiments, the high energy particles 601 can be generated using a particle accelerator. Here, the accelerator can either be a linear accelerator, a plasma immersion ion implantation tool, an ion shower. Under appropriate conditions, mass-selected or non mass-selected implant technologies can be used.

In a specific embodiment the particles cause formation of a plurality of gettering sites or an accumulation region within a cleave region, which is provided beneath the surface region to define a thickness of the bulk material that is to be detached (in some embodiments as a free standing layer). The first plurality of high energy particles may provide an implant profile having a peak concentration and a distribution spatially disposed within a depth of the semiconductor substrate. The distribution can have a width of about 2 μm and less, where this depth variation of an implant concentration profile is called the longitudinal straggle. For a 2 MeV hydrogen implant in GaN, the implant depth is about 25 μm, and the straggle is about 0.7 μm.

In certain embodiments, the cleave region is maintained at a first temperature, which can be provided directly or indirectly. That is, the temperature can be provided by convection, conduction, radiation, or a combination of these techniques according to a specific embodiment. Additionally, the high-energy particle beam may also provide part of the thermal energy and in combination with an external temperature source to achieve the desired implant temperature. In certain embodiments, the high-energy particle beam alone may provide the entire thermal energy desired for implant. That is, the high energy particle beam can be provided that directly causes energy to be converted into thermal energy to increase the temperature of the substrate or bulk material. Of course there can be other variations, modifications, and alternatives.

Depending upon the application, according to particular embodiments smaller mass particles are generally selected to decrease the energy requirement for implantation to a desired depth in a material and to reduce a possibility of damage to the material region according to a preferred embodiment. That is, smaller mass particles more easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral or charged particles including ions such as ion species of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

For example, using hydrogen as the implanted species into a GaN surface as an example, the implantation process is performed using a specific set of conditions. Implantation dose ranges of hydrogen from about $5 \times 10^{16}$ to about $5 \times 10^{17}$ atoms/cm$^2$, and preferably the dose of implanted hydrogen is less than about $2 \times 10^{17}$ atoms/cm$^2$, and may be less than about $5 \times 10^{16}$ atoms/cm$^2$. Implantation energy ranges from about 0.5 MeV and greater to about 2 MeV for the formation of thick films useful for opto-electronic applications. In certain bonded substrate embodiments implantation energy may be below 500 keV, for example 5-180 keV. Implantation temperature ranges from about −50 to about +500 Degrees Celsius, may be between about 100-500 Degree Celsius, and is preferably less than about 700 Degrees Celsius to prevent a possibility of hydrogen ions from diffusing out of the implanted GaN material. Of course, the type of ion used and process conditions depend upon the application.

For higher implant energies, it is particularly useful to have a substantially pure proton implantation (e.g., positive or negatively charged) to allow for a maximum range of the cleaving plane within the reusable substrate. Using GaN as an example, the energy range of implantation can be quite large and span from a few keV for template formation for HB-LED or GaN power electronics applications where a subsequent epitaxial growth is needed to fabricate the GaN device structure, to many MeV yielding substrates measuring tens of micron in thickness for use as a kerfless freestanding wafer starting material. The general range of implant depth as a function of the implant energy can be calculated using, for example SRIM 2013 (Stopping Range In Matter) or a Monte Carlo simulation program (http://www.srim.org/). In a specific embodiment, the GaN film thickness ranges from about 0.05 micrometers to about 1 micrometers using proton implant energy ranges from about 5 keV to about 180 keV. In other embodiments the GaN film may be a free standing GaN layer having a thickness from about 10 micrometers to about 70 micrometers. Of course there can be other variations, modifications, and alternatives.

The terms "detached" or "transferred GaN thickness" in this context mean that the GaN film thickness formed by the implanted ion range can be released to a free standing state or released to a permanent substrate or a temporary substrate for eventual use as a free standing substrate, or eventually mounted onto a permanent substrate. In some embodiments, the GaN material is sufficiently thick and free from a handle or transfer substrate, which acts as a supporting member. Of course, the particular process for handling and processing of the film will depend on the specific process and application.

Embodiments may optionally perform a thermal treatment process on the semiconductor substrate or bulk material to further form the plurality of gettering sites within the cleave region. That is, the thermal treatment process anneals out and/or quenches the cleave region to fix the plurality of first particles in place. The thermal treatment provides a fixed network of defects that can act as efficient sites for gettering and accumulating particles in a subsequent implantation or particle accumulation/diffusion process.

Without being tied to a particular theory or mechanism, in a specific embodiment, the increased temperature is believed to precipitate a network of permanent defects, and may also trap a substantial portion of hydrogen from the first plurality of particles. The defect layer, which is substantially permanent, provides a site for efficient collection and trapping of particles from a subsequent implant and/or diffusion process, which will be described in more detail throughout the present specification and more particularly below.

In accordance with one embodiment, the optional thermal treatment can occur using conduction, convection, radiation, or any combination of these techniques. The particle beam may also provide part of the thermal energy and in combination with an external temperature source to achieve the desired implant temperature. In certain embodiments, the particle beam alone may provide the entire thermal energy desired for implant. Of course, there can be other variations, modifications, and alternatives.

A specific embodiment may include subjecting the surface region of the semiconductor substrate or bulk material to a second plurality of high energy particles, which may be generated using a linear accelerator or other accelerated ion implanter such as a PIII system. The method may include a second plurality of high energy particles, which are provided in the semiconductor substrate or bulk material. The second particles are introduced into the cleave region, which increases a stress level of the cleave region from a first stress level to a second stress level from the second plurality of high velocity particles. In a specific embodiment, the second stress level is suitable for a subsequent cleaving process. In a particular embodiment, the semiconductor substrate or bulk material is maintained at a second temperature, which is higher than the first temperature.

Using hydrogen as the species implanted into the bulk single crystal GaN material in the second implantation step as an example, the implantation process is performed using a specific set of conditions. Implantation dose ranges from about $5 \times 10^{16}$ to about $5 \times 10^{17}$ atoms/cm$^2$, and preferably the dose is less than about $1 \times 10^{17}$ atoms/cm$^2$. Implantation energy ranges from about 5 keV and greater to about 0.5 MeV and greater for the formation of thicker films. Implant dose rate can be provided at about 500 microamperes to about 100 milliamperes and a total dose rate can be calculated by integrating an implantation rate over the expanded beam area. Implantation temperature ranges from about −50 Degree Celsius to about 700 Degrees Celsius, and is preferably less than about 500 Degrees Celsius. In a specific embodiment, the temperature and dose are selected to allow for efficient capture of molecular hydrogen, while there may be some diffusion of mono-atomic hydrogen. Of course, the type of ion used and process conditions depend upon the application.

For higher implant energies, it may be useful to have a substantially pure proton implantation (e.g., positive or negatively charged) to allow for a maximum range of the cleaving plane within the reusable substrate. Using GaN as an example, the energy range of implantation can be large and span from a few keV for template formation for HB-LED or GaN power electronics applications where a subsequent epitaxial growth is needed to fabricate the GaN device structure, to many MeV yielding substrates measuring tens of micron in thickness for use as a kerfless freestanding wafer starting material. The general range of implant depth as a function of the implant energy can be calculated using, for example SRIM 2013 (Stopping Range In Matter) or a Monte Carlo simulation program (http://www.srim.org/). In a specific embodiment, the GaN film thickness ranges from about 0.05 micrometers to about 1 micrometers using proton implant energy ranges from about 5 keV to about 180 keV. In some embodiments the GaN film may be a free standing GaN layer having a thickness from about 10 micrometers to about 70 micrometers. Of course there can be other variations, modifications, and alternatives.

Effectively, the implanted particles add stress or reduce fracture energy along a plane parallel to the top surface of the substrate or bulk material at the selected depth. The energies depend, in part, upon the implantation species and conditions. These particles reduce a fracture energy level of the substrate or bulk material at the selected depth. This allows for a controlled cleave along the implanted plane at the selected depth. Implantation can occur under conditions such that the energy state of the substrate or bulk material at all internal locations is insufficient to initiate a non-reversible fracture (i.e., separation or cleaving) in the substrate or bulk material. It should be noted, however, that implantation does generally cause a certain amount of defects (e.g., micro-detects) in the substrate or bulk material that can typically at least partially be repaired by subsequent heat treatment, e.g., thermal annealing or rapid thermal annealing.

A mass-selected high-energy implant approach, which has the appropriate beam intensity could be used to manufacture thicker cleaved bulk materials. To be cost-effective, the implant beam current should be on the order of a few tens of milliamps of $H^+$ or $H^-$ ion beam current. If the system can implant such sufficiently high energies, $H_2^+$ ions can also be advantageously utilized for achieving higher dose rates. Ion implant apparatuses useful for embodiments of the present invention have been made recently available by the use of DC electrostatic particle accelerators such as the DYNAMITRON proton accelerator available from Ion Beam Applications SA, Belgium or proton accelerators available from Phoenix Nuclear Laboratories, of Madison Wis., or Pantechnik of Bayeux, France. Other forms of DC electrostatic accelerators which may be used include Van de Graaff or Tandem Van de Graaff accelerator types.

Still other forms of particle accelerators suitable for use in accordance with embodiments of the present invention may include radio frequency (RF) particle accelerators such as a cyclotron or a RF linear accelerator (RF Linac). Examples of possible particle accelerator types include radio-frequency quadrupole linear accelerator (RFQ-Linac) or Drift-Tube Linac (DTL), or RF (Radio)-Focused Interdigitated (RFI) technology. These are available from companies such as Accsys Technology Inc. of Pleasanton, Calif., Linac Systems, LLC of Albuquerque, N. Mex. 87109, and others.

In a specific embodiment, these approaches use RF acceleration of an extracted proton beam to increase the total energy of the proton beam from a range of approximately 20-100 keV to 0.5 to 7 MeV or more. The output beam is usually on the order of a few millimeters in diameter and for use in this application would require the use of beam expansion to the order of a few hundred millimeters on a side to a meter or more in order to keep the power flux impinging on the target surface from becoming too large and possibly overheating or damaging the target surface. The proton current available with these technologies can be up to 100 mA or more. As a specific example, assuming 100 kW of beam power, a 3.25 MeV RFQ/RFI-Linac would yield a proton beam current of about 31 mA. Using a dose of approximately $1 \times 10^{17}$ $H/cm^2$ and an expanded beam of about 500 mm×500 mm, the GaN area processed per hour at the target implantation dose is about 0.7 square meters while the power flux is kept to about 13 Watts/cm². This combination of parameters makes this approach particularly practical for cost effective HB-LED substrate material production. Of course, there can be other variations, alternatives, and modifications.

Optionally, specific embodiments may include a thermal treatment process after the implanting process. According to a specific embodiment, the present method uses a thermal process ranging from about 150 to about 800 Degrees Celsius for GaN material. In an embodiment, the thermal treatment can occur using conduction, convection, radiation, or any combination of these techniques. The high-energy particle beam may also provide part of the thermal energy and in combination with an external temperature source to achieve the desired implant temperature. In certain embodiment, the high-energy particle beam alone may provide the entire thermal energy desired for implant. In a preferred embodiment, the treatment process occurs to season the cleave region for a subsequent cleave process. Of course, there can be other variations, modifications, and alternatives.

Specific embodiments may include a cleave initiation step, wherein some energy is applied to the cleave portion to begin cleaving. As described in detail below, this cleave initiation could involve the application of different types of energy, having different characteristics.

Specific embodiments include a step of freeing the thickness of detachable material, (which may or may not be free standing), using a cleaving process. In a specific embodiment, the step of freeing can be performed using a controlled cleaving process. The controlled cleaving process provides a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As shown, the method in accordance with an embodiment of the present invention frees the thickness of material (which may be free standing) from the substrate or bulk material to completely remove the thickness of material. Of course, there can be other variations, alternatives, and modifications.

A method may use one or more patterned regions to facilitate initiation of a cleaving action. In a specific embodiment, the present method provides a semiconductor substrate having a surface region and a thickness. The method includes subjecting the surface region of the semiconductor substrate to a first plurality of high energy particles generated using a particle accelerator to form a patterned region of a plurality of gettering sites within a cleave region. In a preferred embodiment, the cleave region is provided beneath the surface region to defined a thickness of material to be detached. The semiconductor substrate is maintained at a first temperature. The method also includes subjecting the semiconductor substrate to a treatment process, e.g., thermal treatment. The method includes subjecting the surface region of the semiconductor substrate to a second plurality of high energy particles, which have been provided to increase a stress level of the cleave region from a first stress level to a second stress level. The method includes initiating the cleaving action at a selected region of the patterned region to detach a portion of the thickness of detachable material using a cleaving process and freeing the thickness of detachable material using a cleaving process.

In one embodiment, the patterned implant sequence subjects the surface to a dose variation where the initiation area is usually developed using a higher dose and/or thermal budget sequence. Propagation of the cleaving action to complete the cleaving action can occur using additional dosed regions to guide the propagating cleave front. Alternatively, cleaving propagation can be accomplished by following a depth that is guided using stress-control. Propagation of the cleaving can be achieved by following a natural crystallographic cleave plane. One or more of these techniques may be applied in conjunction with one another. Some or most of the area may be implanted at a lesser dose or not implanted at all depending on the particular cleaving technique used. Such lower dosed regions can help improve overall productivity of the implantation system by reducing the total dose needed to detach each film from the substrate.

In a specific embodiments, methods can perform other processes. For example, the method can place the thickness of detached material on a support member, which is later processed. Additionally or optionally, the method in accordance with an embodiment of the present invention performs one or more processes on the semiconductor substrate or bulk material before subjecting the surface region with the first plurality of high energy particles, or between the implanting step(s) and the cleaving step. Depending upon the particular embodiment, the processes can be for the formation of illumination devices, or layers used within a cell process, integrated circuits, optical devices, any combination of these, and the like. Of course, there can be other variations, modifications, and alternatives.

As described above, improved techniques for removing a thin film of material from a substrate using a controlled cleaving action are provided. This technique allows an initiation of a cleaving process on a substrate using a single or multiple cleave region(s) through the use of controlled energy (e.g., spatial distribution) and selected conditions to allow an initiation of a cleave front(s) and to allow it to propagate through the substrate to remove a thin film of material from the substrate.

In a specific embodiment, a process is provided for forming a film of material from a donor substrate using a controlled cleaving process. The process includes a step of introducing energetic particles (e.g., charged or neutral molecules, atoms, or electrons having sufficient kinetic energy) through a surface of a donor substrate to a selected depth underneath the surface, where the particles are at a relatively high concentration to define a thickness of donor substrate material (e.g., thin film of detachable material) above the selected depth. To cleave the donor substrate material, the method provides energy to a selected region of the donor substrate to initiate a controlled cleaving action in the donor substrate, whereupon the cleaving action is made using a propagating cleave front(s) to free the donor material from a remaining portion of the donor substrate.

A cleave may be initiated by subjecting the material with sufficient energy to fracture the material in one region, causing a cleave front, without uncontrolled shattering or cracking. The cleave front formation energy must often be made lower than the bulk material fracture energy at each region to avoid shattering or cracking the material. The directional energy impulse vector in diamond cutting or the scribe line in glass cutting are, for example, the means in which the cleave energy is reduced to allow the controlled creation and propagation of a cleave front. The cleave front is in itself a higher stress region and once created, its propagation requires a lower energy to further cleave the material from this initial region of fracture. The energy required to propagate the cleave front is called the cleave front propagation energy. The relationship can be expressed as:

$$Ec=Ep+[\text{cleave front stress energy}]$$

A controlled cleaving process is realized by reducing Ep along a favored direction(s) above all others and limiting the available energy to below the Ep of other undesired directions. In any cleave process, a better cleave surface finish occurs when the cleave process occurs through only one expanding cleave front, although multiple cleave fronts do work.

Numerous benefits are achieved over pre-existing techniques using the present invention. In particular, the present invention uses controlled energy and selected conditions to preferentially cleave a thin film of material from a donor substrate which includes multi-material sandwiched films. This cleaving process selectively removes the thin film of material from the substrate while preventing a possibility of damage to the film or a remaining portion of the substrate. Accordingly, the remaining substrate portion can be re-used repeatedly for other applications.

Additionally, the present invention uses a relatively low temperature during the controlled cleaving process of the thin film to reduce temperature excursions of the separated film, donor substrate, or multi-material films according to other embodiments. This lower temperature approach allows for more material and process latitude such as, for example, cleaving and bonding of materials having substantially different thermal expansion coefficients. In other embodiments, the present invention limits energy or stress in the substrate to a value below a cleave initiation energy, which generally removes a possibility of creating random cleave initiation sites or fronts. This reduces cleave damage (e.g., pits, crystalline defects, breakage, cracks, steps, voids, excessive roughness) often caused in pre-existing techniques. Moreover, embodiments can reduce damage caused by higher than necessary stress or pressure effects and nucleation sites caused by the energetic particles as compared to pre-existing techniques. film" of material.

A variety of techniques can be used to implant the energetic particles into the GaN material. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Examples of plasma immersion ion implantation techniques are described in "Recent Applications of Plasma Immersion Ion Implantation," Paul K. Chu, Chung Chan, and Nathan W. Cheung, SEMICONDUCTOR INTERNATIONAL, pp. 165-172, Jun. 1996, and "Plasma Immersion Ion Implantation—A Fledgling Technique for Semiconductor Processing," P. K. Chu, S. Qin, C. Chan, N. W. Cheung, and L. A. Larson, MATERIALS SCIENCE AND ENGINEERING REPORTS: A REVIEW JOURNAL, pp. 207-280, Vol. R17, Nos. 6-7, (Nov. 30, 1996), which are both hereby incorporated by reference for all purposes. Of course, techniques used depend upon the application.

A basic configuration of one PIII system may utilize a target holder supporting the target to be implanted. The target holder may comprise a high-voltage isolated cooled chuck with electrostatic or mechanical clamping to allow the target material to be thermally contacted to the target holder. This can be accomplished by conduction cooling (e.g. through an elastomer or other compliant layer allowing efficient contacting of the backside of the target) or by convection cooling (e.g. by developing gas pressure between the backside of the target and the target holder). Sometimes, a combination of conduction and convection cooling may be employed. During this plasma soak time, the target is directly immersed in the plasma.

A target holder and target may be briefly pulsed to a large negative voltage (−V). During this time, a sheath free of charged particles is developed around the target holder assembly. The voltage is dropped across the thickness of the sheath.

Implantation occurs by the positive charges diffusing across the plasma/sheath interface to accelerate and strike the surface of the target holder assembly with energy equal to V. For example, a pulse of −40 kV could accelerate H+ protons within a hydrogen plasma to an energy of 40 keV. This implantation process continues at a rate determined by parameters such as the plasma density and ion specie. To avoid arcing, the high-voltage may be applied for a brief period of time and repeated at a selected repetition rate. Typical PIII operating parameters can be 20-1000 Hz repetition frequency (Fr), and pulse widths (Tp) of a few microseconds to more than 100 microseconds. If the peak ion current (Iion) and effective target holder area (A) are known, the dose rate can be calculated as:

Dose Rate (ions/cm$^2$)=$I_{ion} \times Fr \times Tp/qA$, where $q$ is the electronic charge.

When charged particles hit the target holder assembly, secondary electrons are ejected from the surface to be accelerated in the reverse direction. The electron yield (number of electrons emitted per positive charged particle implanted) is called gamma (γ).

Typical gamma factors are 2-5. Therefore, the net pulse current is dominated by the secondary electron current. Since these electrons hit the plasma chamber walls and decelerate, x-rays are produced at implant energies (V) exceeding 30-40 kV. In an example, the total current and implant power may be:

Implant Current=$I_{ion} \times (1+\gamma) \times Fr \times Tp$

Implant Power=$I_{ion} \times (1+\gamma) \times Fr \times Tp \times V$

Depending upon the application, smaller mass particles may reduce a possibility of damage to the material region. That is, smaller mass particles easily travel through the substrate material to the selected depth without substantially damaging the material region that the particles traverse through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as ions of hydrogen and its isotopes, rare gas ions such as helium and its isotopes, and neon. The particles can also be derived from compounds such as gases, e.g., hydrogen gas, water vapor, methane, and hydrogen compounds, and other light atomic mass particles. Alternatively, the particles can be any combination of the above particles, and/or ions and/or molecular species and/or atomic species. The particles generally have sufficient kinetic energy to penetrate through the surface to the selected depth underneath the surface.

For example, using hydrogen as the implanted species into a GaN surface as an example, the implantation process may be performed using a specific set of conditions. Implantation dose ranges of hydrogen from about $5 \times 10^{16}$ to about $5 \times 10^{17}$ atoms/cm$^2$, and the dose of implanted hydrogen can be less than about $2 \times 10^{17}$ atoms/cm$^2$, and may be less than about $5 \times 10^{16}$ atoms/cm$^2$. Implantation energy may range from about 0.5 MeV and greater to about 2 MeV for the formation of thick films useful for opto-electronic applications. In certain bonded substrate embodiments implantation energy may be below 500 keV, for example 5-180 keV. Implantation temperature ranges from about −50 to about +500 Degrees Celsius, may be between about 100-500 Degree Celsius, and can be less than about 700 Degrees Celsius to prevent a possibility of hydrogen ions from diffusing out of the implanted GaN material. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-defects) in the substrate that can typically at least partially be repaired by subsequent heat treatment, e.g., thermal annealing or rapid thermal annealing.

A controlled cleaving process may utilize pulsed energy. A pulse 1 has an energy level which exceeds average cleaving energy (E), which is the necessary energy for initiating the cleaving action. Pulses 2 and 3 are made using lower energy levels along the cleave front to maintain or sustain the cleaving action. In a specific embodiment, the pulse is a laser pulse where an impinging beam heats a selected region of the substrate through a pulse and a thermal pulse gradient causes supplemental stresses which together exceed cleave formation or propagation energies, which create a single cleave front. In preferred embodiments, the impinging beam heats and causes a thermal pulse gradient simultaneously, which exceeds cleave energy formation or propagation energies. More preferably, the impinging beam cools and causes a thermal pulse gradient simultaneously, which exceeds cleave energy formation or propagation energies.

Optionally, a built-in energy state of the substrate or stress can be globally raised toward the energy level necessary to initiate the cleaving action, but not enough to initiate the cleaving action before directing the multiple successive impulses to the substrate according to the present invention. The global energy state of the substrate can be raised or lowered using a variety of sources such as chemical, mechanical, thermal (sink or source), or electrical, alone or in combination. The chemical source can include a variety such as particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermoelectric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used also depends upon the application. As noted, the global source increases a level of energy or stress in the material region without initiating a cleaving action in the material region before providing energy to initiate the controlled cleaving action.

In a specific embodiment, an energy source elevates an energy level of the substrate cleave plane above its cleave front propagation energy but is insufficient to cause self-initiation of a cleave front. In particular, a thermal energy source or sink in the form of heat or lack of heat (e.g., cooling source) can be applied globally to the substrate to increase the energy state or stress level of the substrate without initiating a cleave front. Alternatively, the energy source can be electrical, chemical, or mechanical. A directed energy source provides an application of energy to a selected region of the substrate material to initiate a cleave front which self-propagates through the implanted region of the substrate until the thin film of material is removed. A variety of techniques can be used to initiate the cleave action.

In an embodiment, the energy level or state of the substrate is raised using a global energy source above the cleave front propagation energy state, but is lower than the energy state necessary to initiate the cleave front. To initiate the cleave front, an energy source such as a laser directs a beam in the form of a pulse at an edge of the substrate to initiate the cleaving action. Alternatively, the energy source can be a cooling fluid (e.g., liquid, gas) that directs a cooling medium in the form of a pulse at an edge of the substrate to initiate the cleaving action. The global energy source maintains the cleaving action which generally requires a lower energy level than the initiation energy.

An alternative aspect utilizes an energy source to increase a global energy level of the substrate using a light beam or heat source to a level above the cleave front propagation energy state, but lower than the energy state necessary to initiate the cleave front. The substrate undergoes a rotational force turning clockwise on top surface and a rotational force turning counter-clockwise on the bottom surface which creates stress at the implanted region to initiate a cleave front. Alternatively, the top surface undergoes a counter-clockwise rotational force and the bottom surface undergoes a clockwise rotational force. Of course, the direction of the force generally does not matter in this embodiment.

The removed material region provides a thin film of GaN material for processing. The GaN material possesses limited surface roughness and desired planarity characteristics for use in a epitaxial growth substrate. In certain embodiments, the surface roughness of the detached film has features that are less than about 60 nm, or less than about 40 nm, or less than about 20 nm. Accordingly, embodiments of the present invention may provide thin GaN films which can be smoother and more uniform than pre-existing techniques.

In a specific embodiment, the energy source can be a fluid jet that is pressurized (e.g., compressional) according to an embodiment of the present invention. In an embodiment, the energy source can be a compressional source such as, for example, compressed fluid that is static. Optionally, a mechanical force, as from a pin or blade, may be applied to the edge of the implanted region to initiate the cleaving process, which typically reduces the maximum pressure differential required between the chamber and the ambient.

Embodiments may be practiced at temperatures that are lower than those used by pre-existing techniques. In particular, embodiments do not require increasing the entire substrate temperature to initiate and sustain the cleaving action as pre-existing techniques. In some embodiments for GaN wafers and hydrogen implants, substrate temperature does not exceed about 500° C. during the cleaving process. Alternatively, substrate temperature does not exceed about 400° C. during the cleaving process. Alternatively, substrate temperature is kept substantially below implanting temperatures via a thermal sink, e.g., cooling fluid, cryogenic fluid. Accordingly, embodiments of the present invention may reduce a possibility of unnecessary damage from an excessive release of energy from random cleave fronts, which generally improves surface quality of a detached film(s) and/or the substrate(s). Accordingly, embodiments of the present invention may provide resulting films on substrates at higher overall yields and quality.

A substrate can be disposed on a workpiece such as a stiffener or the like before the controlled cleaving process. The workpiece joins to a top surface or implanted surface of the substrate to provide structural support to the thin film of material during controlled cleaving processes. The workpiece can be joined to the substrate using a variety of bonding or joining techniques, e.g., electro-statics, adhesives, interatomic, thermo-compression. Some of these bonding techniques are described herein. The workpiece can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of workpiece used will depend upon the application.

Alternatively, the substrate having the film to be detached can be temporarily disposed on a transfer substrate such as a stiffener or the like before the controlled cleaving process. The transfer substrate joins to a top surface or implanted surface of the substrate having the film to provide structural support to the thin film of material during controlled cleaving processes. The transfer substrate can be temporarily joined to the substrate having the film using a variety of bonding or joining techniques, e.g., electro-statics, adhesives, interatomic. Some of these bonding techniques are described herein.

The transfer substrate can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of transfer substrate used will depend upon the application. Additionally, the transfer substrate can be used to remove the thin film of material from the cleaved substrate after the controlled cleaving process.

A GaN HB-LED Growth Substrate Process for fabricating a GaN HB-LED growth substrate according to particular embodiments, may be briefly outlined as follows:

(1) Provide a donor GaN wafer (which may be a multi-stack wafer comprising a GaN layer bonded onto a metal or metal-alloy substrate and optionally coated with additional layers of material);

(2) Introduce particles into the donor GaN wafer to a selected depth to define a thickness of GaN film;

(3) Provide a target substrate material (which may be coated with thin-film(s) of material);

(4) Bond the donor GaN wafer to the target substrate material by joining the implanted face to the target substrate material;

(5) Increase global stress (or energy) of implanted region at selected depth without initiating a cleaving action (optional);

(6) Provide stress (or energy) to a selected region of the bonded substrates to initiate a controlled cleaving action at the selected depth;

(7) Provide additional energy to the bonded substrates to sustain the controlled cleaving action to free the thickness of GaN film from the donor GaN wafer (optional);

(8) Complete bonding of donor GaN wafer to the target substrate; and (9) Polish a surface of the thickness of GaN film.

The above sequence of steps provides a step of initiating a controlled cleaving action using an energy applied to a selected region(s) of a multi-layered substrate structure to form a cleave front(s) according to the present invention. This initiation step begins a cleaving process in a controlled manner by limiting the amount of energy applied to the substrate. Further propagation of the cleaving action can occur by providing additional energy to selected regions of the substrate to sustain the cleaving action, or using the energy from the initiation step to provide for further propagation of the cleaving action. This sequence of steps is merely an example and should not limit the scope of the claims defined herein. Further details with regard to the above sequence of steps are described below.

The above steps describe a specific example of a controlled cleaving action, but embodiments are not limited to these particular conditions. For example, controlled cleaving could simply be accomplished by the application of global stress (energy) that gives rise to the separation of material, without special conditions occurring at separate pre-initiation, initiation, and sustaining phases.

If a substitutional GaN HB-LED growth substrate comprising a sapphire workpiece or target substrate with a high-quality GaN growth surface is desired, a modified bond process using insulating layer(s) may be selected. In a particular embodiment, both the GaN surface and the sapphire target substrate can be coated with a bond promoting layer such as a silicon dioxide film and/or an aluminum nitride film. For the GaN donor, this oxide film may be of limited thickness to allow the desired implant depth. For example, a 50 nm film would lower the GaN cleave layer from 250 nm to 200 nm. The oxide film thickness on the sapphire substrate can be selected from a wide range of values that allow good bond yield and device performance. Typical oxide film thickness for the sapphire workpiece is 75-200 nm. One or more films can be applied using a RF or reactive sputtering process or via plasma-enhanced CVD (PECVD) process. In some embodiments an insulating film can be spun on.

After deposition, the low temperature films may be treated to promote good bondability. Typical treatment conditions can include a densification anneal and a clean/etch chemical bath that removes asperities and surface contaminants.

The densification anneal is done in an inert environment at 700-1000° C. for typically 1-10 minutes using a Rapid Thermal Processing or 30-60 minutes in a furnace. Incorporated by reference herein for all purposes is the following paper to Choi et al.: "Densification of Radio Frequency Sputtered Silicon Oxide Films by Rapid Thermal Annealing", Journal of Applied Physics, Vol. 83, No. 4 (February 1998). The oxide film on the GaN can also act as a capping layer which limits GaN decomposition.

Because the densification anneal is typically done at high temperatures, the implant step may be performed after the anneal so as to protect the hydrogen cleave plane from diffusing and being rendered ineffective.

The sapphire substrate can be of different varieties to allow a substitutional sapphire-based growth template to meet the desired specifications. The following are some of the structures and options that can be integrated within this substrate:

1. a single-side polished sapphire for low-cost;
2. a double-side polished sapphire to allow laser lift-off back-end LED manufacturing where the LED layer is removed from the sapphire growth substrate;
3. an integrated pattern on the sapphire substrate to allow light extraction methods similar to PSS (Patterned Sapphire Substrate). Film deposition and planarization steps may be required to allow bonding. An index of refraction of the filler material may be selected to allow the scattering effect to occur efficiently. Aluminum nitride and silicon dioxide may be used.
4. Integrating a reflector layer on a planar or PSS sapphire surface that will act as a mirror layer. Electrical conductivity may also be achieved if the planarization and bonding allows the surface to have exposed metal.

Selected energetic particles implant through the top surface of the donor GaN wafer to a selected depth, which defines the thickness of the material region, termed the thin film of material. As shown, the particles have a desired concentration at the selected depth (z0). A variety of techniques can be used to implant the energetic particles into the donor GaN wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Of course, techniques used depend upon the application.

Depending upon the application, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions of hydrogen and its isotopes, rare gas ions such as helium and its isotopes, and neon. The particles can also be derived from compounds such as gases, e.g., hydrogen gas, water vapor, methane, and other hydrogen compounds, and other light atomic mass particles. Alternatively, the particles can be any combination of the above particles, and/or ions and/or molecular species and/or atomic species.

The process according to certain embodiments uses a step of joining the implanted donor GaN wafer to a workpiece or target wafer. The workpiece may also be a variety of other types of substrates such as those made of a dielectric material (e.g., quartz, glass, sapphire, silicon nitride, silicon dioxide, aluminum nitride, mullite), a conductive material (silicon, polysilicon, group III/V materials, metal), and plastics (e.g., polyimide-based materials). Specifically, dielectric materials such as aluminum nitride (AlN) or mullite ($Al_2O_3$:$SiO_2$) can be made to have a CTE value close to GaN and both have the requisite thermal and chemical robustness necessary to function as a mechanical substrate for the GaN film within the MOCVD growth environment. In the present example, however, the workpiece is a CTE-matched metal wafer.

In a specific embodiment, the GaN donor and target wafers are joined or fused together using a low temperature thermal step. The low temperature thermal process generally ensures that the implanted particles do not place excessive stress on the material region, which can produce an uncontrolled cleave action. In one aspect, the low temperature bonding process occurs by a self-bonding process. In particular, one wafer is stripped to remove oxidation therefrom (or one wafer is not oxidized). A cleaning solution treats the surface of the wafer to form O—H bonds on the wafer surface. An example of a solution used to clean the wafer is a mixture of H2O2-H2SO4. A dryer dries the wafer surfaces to remove any residual liquids or particles from the wafer surfaces. Self-bonding occurs by placing a face of the cleaned wafer against the face of an oxidized wafer.

Alternatively, a self-bonding process occurs by activating one of the wafer surfaces to be bonded by plasma cleaning. In particular, plasma cleaning activates the wafer surface using a plasma derived from gases such as argon, ammonia, neon, water vapor, nitrogen, and oxygen. The activated wafer surface is placed against a face of the other wafer, which has a coat of oxidation thereon. The wafers are in a sandwiched structure having exposed wafer faces. A selected amount of pressure is placed on each exposed face of the wafers to self-bond one wafer to the other.

Alternatively, an adhesive disposed on the wafer surfaces is used to bond one wafer onto the other. The adhesive includes an epoxy, polyimide-type materials, and the like. Spin-on-glass layers can be used to bond one wafer surface onto the face of another. These spin-on-glass ("SOG") materials include, among others, siloxanes or silicates, which are often mixed with alcohol-based solvents or the like. SOG can be a desirable material because of the low temperatures (e.g. 150 to 250° C.) often needed to cure the SOG after it is applied to surfaces of the wafers.

Alternatively, a variety of other low temperature techniques can be used to join the donor wafer to the target wafer. For instance, an electro-static bonding technique can be used to join the two wafers together. In particular, one or both wafer surface(s) is charged to attract to the other wafer surface. Additionally, the donor wafer can be fused to the target wafer using a variety of commonly known techniques such as thermo-compression bonding. Of course, the technique used depends upon the application.

After bonding the wafers into a sandwiched structure, the method includes a controlled cleaving action to remove the substrate material to provide a thin film of substrate material overlying interface layer(s) on the target metal wafer. The controlled-cleaving occurs by way of selective energy placement or positioning or targeting of energy sources onto the donor and/or target wafers. For instance, an energy impulse(s) can be used to initiate the cleaving action. The impulse (or impulses) is provided using an energy source which include, among others, a mechanical source, a chemical source, a thermal sink or source, and an electrical source.

The controlled cleaving action is initiated by way of any of the previously noted techniques and others. For instance, a process for initiating the controlled cleaving action uses a step of providing energy to a selected region of the substrate to initiate a controlled cleaving action at the selected depth (z0) in the substrate, whereupon the cleaving action is made using a propagating cleave front to free a portion of the substrate material to be removed from the substrate. In a specific embodiment, the method uses a single impulse to begin the cleaving action, as previously noted. Alternatively, the method uses an initiation impulse, which is followed by another impulse or successive impulses to selected regions of the substrate. Alternatively, the method provides an impulse to initiate a cleaving action which is sustained by a scanned energy along the substrate. Alternatively, energy can be scanned across selected regions of the substrate to initiate and/or sustain the controlled cleaving action.

Optionally, an energy or stress of the substrate material is increased toward an energy level necessary to initiate the cleaving action, but not enough to initiate the cleaving action before directing an impulse or multiple successive impulses to the substrate according to the present invention. The global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermo-electric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time varying, spatially varying, or continuous. Still further, any of the above embodiments can be combined or even separated, depending upon the application. Of course, the type of source used depends upon the application. As noted, the global source increases a level of energy or stress in the material region without initiating a cleaving action in the material region before providing energy to initiate the controlled cleaving action.

In an embodiment, the method maintains a temperature which is below a temperature of introducing the particles into the substrate. In some embodiments, the substrate temperature is maintained between −200 and 450° C. during the step of introducing energy to initiate propagation of the cleaving action. Substrate temperature can also be maintained at a temperature below 400° C. In certain embodiments, the method uses a global thermal source and a mechanical source to initiate and maintain the cleaving action.

A final bonding step occurs between the target wafer and thin film of material region according to some embodiments. In one embodiment, one metal wafer has overlying layers of metallic and conductive material including a bond layer of copper, which is deposited overlying the face before cleaving the thin film of material. The copper layer can also be formed using a variety of other techniques, e.g., sputtering. The copper layer between the wafer surfaces are fused together using thermal-compression bonding. Typical thermo-compression processes for Copper-Copper bonding are (i) temperatures between 100-400 C, (ii) pressures between 0.5-1 MPa and (iii) process time from a few minutes to a few hours depending on exact conditions.

Under certain conditions, it may be advantageous to change the copper thickness ratio from 50/50 between the donor and target substrate, to one where the donor copper thickness is minimized in order to move the bond layer as close as possible to the cleave plane to facilitate cleave initiation. For example 1 um/1 um copper thermo-compression bond layers can be redesigned to become 0.25 um/2 um (donor Cu thickness/target substrate Cu thickness), to move the bond interface to about 0.25 um from the donor material surface. Using Ansys simulation, the initiation moment-energy coupling is improved from 25% to 31% of the reference configuration during cleave propagation (bond interface coincident with the cleave interface).

Another method to reduce initiation energy according to certain embodiments, would include removing or "trenching" a limited edge area of the donor substrate coincident with the initiation area prior to bonding. This can increase the edge initiation energy at the cleave plane by 2-3×. This result and improvement was confirmed by using Ansys finite analysis simulations.

The detached surface of the film of GaN material may be rough and need finishing. Finishing occurs using a combination of grinding and/or polishing techniques.

In some embodiments, the detached surface undergoes lapping and polishing steps using, for examples, techniques such as rotating an abrasive material underlaying the detached surface to remove any imperfections or surface roughness therefrom. A machine such as a "PM5 lapping & polishing system" made by a company called Logitech Limited of Glasgow, Scotland (UK) may provide this technique.

Alternatively, chemical mechanical polishing or planarization ("CMP") techniques finish the detached surface of the film. In CMP, a slurry mixture is dripped directly to a polishing surface which is attached to a rotating platen. This slurry mixture can be transferred to the polishing surface by way of a chute, which is coupled to a slurry source. The slurry is often a solution containing alumina abrasive particles and an oxidizer, e.g., sodium hypochlorite (NaOCl) or alkaline colloidal silica, which are sold under trade names of SF1 or Chemlox by Logitech Limited. The abrasive is often an aluminum oxide, aluminum trioxide, amorphous silica, silicon carbide, diamond powder, and any mixtures thereof. This abrasive is mixed in a solution of deionized water and oxidizer or the like. The solution may be acidic.

This acid solution generally interacts with the gallium nitride material from the wafer during the polishing process. The polishing process preferably uses a very rigid polyurethane polishing pad. An example of this polishing pad is one made by Rodel and sold under the trade name of IC-1000. The polishing pad is rotated at a selected speed. A carrier head which picks up the target wafer having the film applies a selected amount of pressure on the backside of the target wafer such that a selected force is applied to the film. The polishing process removes about a selected amount of film material, which provides a relatively smooth film surface for subsequent processing. Depending on whether N-face or Ga-face GaN is to be polished off, slurry with suitable abrasive particle sizes and polishing pads may be used accordingly. As examples, colloidal silica may be used for N-face and sodium hypochlorite may be used for Ga-face.

Other than and/or in addition to polishing, there are a number of other surface preparation options that can be employed to prepare the surface condition of the GaN layer, once it has been transferred from the high quality single crystal GaN bulk substrate to the workpiece. A purpose of this surface preparation is to recover the crystalline quality of the transferred GaN layer that may be compromised or damaged due to the implantation or cleaving step.

a. Thermal annealing in a furnace with or without a protective cap, such as silicon dioxide or AlN. This cap is required if the anneal temperature and ambient gas conditions.

b. For GaN in 1 atm nitrogen ambient, the decomposition temperature of the GaN can be as low as 800-900° C. If a cap layer is used, the anneal temperature without GaN crystal decomposition can be substantially higher.

c. Plasma dry etch to remove a limited thickness of the GaN surface to remove the damaged surface region and allow high-quality epitaxial growth.

d. Wet chemical etch to remove a limited thickness of the GaN surface to remove the damaged surface region and allow high-quality epitaxial growth.

e. Anneal and etch in a MOCVD reactor prior to epitaxial GaN growth. This is similar technique as a. above, except that this can be done in-situ in an MOCVD reactor.

It is of course also possible to use the as-cleaved GaN surface without prior surface preparation if the subsequent epitaxial growth step yields a GaN crystal of sufficient quality. As referenced herein and in the figures, the term "polish" may refer to some sort of surface treatment, which may or may/not include polishing, depending upon the particular embodiment.

Although the above description is in terms of a donor GaN wafer, other substrates may also be used. For example, the substrate can be almost any monocrystalline, polycrystalline, or even amorphous type substrate. Additionally, the substrate can be made of sapphire, III/V materials such as gallium arsenide or Group IV materials such as silicon, silicon carbide, and others. The multi-layered substrate can also be used according to the present invention. The multi-layered substrate includes a GaN layer substrate, a variety of sandwiched layers on a semiconductor substrate, and numerous other types of substrates. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

Another embodiment may attach a film of single-crystal film that can serve as a heteroepitaxial growth seed layer. The attachment could occur by placing a frame of the thin crystalline metallic film onto the target substrate and cutting the film at the periphery. The film can be then made permanent by a thermal treatment or the like. Examples of metallic single-crystal films for GaN heteroepitaxial growth are Cu (111) & (110), Mo (111) & (110) using buffer layers such as AlN and HfN. Other metals such as Ag have also been studied as seed layers for GaN growth. Since these metals have ductile properties, in some cases a negative lattice mismatch (metal lattice spacing<GaN lattice spacing) can be addressed by stretching the film prior to mounting onto the target substrate.

Another embodiment provides a method that includes providing a semiconductor workpiece including a surface region, introducing a plurality of particles through the surface region to form a cleave region in the semiconductor workpiece, applying energy to cleave a detached thickness of semiconductor material from a remainder of the semiconductor workpiece, and bonding the detached thickness of semiconductor material to a substrate having a coefficient of thermal expansion approximately equal to a coefficient of thermal expansion of the layer of additional material.

In an embodiment, the bonding comprises releasable bonding between the additional layer of material and the substrate.

In an embodiment, the releasable bonding is based upon a surface roughness of the detached thickness of semiconductor material and/or a surface roughness of the substrate.

In an embodiment, the releasable bonding is based upon a sacrificial material present between a detached thickness of semiconductor material and the substrate.

In an embodiment, the detached thickness of semiconductor material is between about 10-100 um.

In an embodiment, the semiconductor material is bonded and the detached thickness of semiconductor material is between about 0.05-1 um.

In an embodiment, the semiconductor material is bonded and the intervening layers include a reflective layer.

In an embodiment, the semiconductor material is bonded with intervening layers enabling the detached thickness of semiconductor material to be made thermally and electrically conductive to the metal substrate.

In an embodiment, the semiconductor material is bonded with an intervening electrically insulating layer enabling the detached thickness of semiconductor material to be made thermally conductive but electrically insulated to the metal substrate.

In an embodiment, the substrate comprises a metal substrate.

In an embodiment, providing the semiconductor workpiece comprises providing a bulk ingot, and the method further comprises detaching a layer of the semiconductor workpiece bearing the GaN by controlled cleaving.

In an embodiment, the controlled cleaving comprises cleaving along a cleave region formed by implantation of particles through the GaN into the semiconductor workpiece.

In an embodiment, providing the semiconductor workpiece comprises providing a wafer separated from a bulk ingot by sawing.

In an embodiment, the method also includes relaxing a stress in the GaN.

In an embodiment, relaxing the stress comprises removing at least a portion of the semiconductor workpiece.

In another embodiment of the method, the substrate comprises Molybdenum or Molybdenum alloy.

In conclusion, at least the following variations falling within the scope of particular embodiments, are noted. Certain embodiments may utilize various donor underlying substrates and reflector/barrier/encapsulant layers, including backing technology for enhancing cleaving. According to some embodiments, a donor can comprise GaN, Si, SiC or other semiconductor material. After cleaving, the material may be polished/prepared for further growth.

1. A method comprising:
   providing a donor comprising GaN;
   bonding the donor to a handle utilizing a first bond-and-release system in a first state;
   changing the first bond-and-release system to a second state to release the handle including GaN from the donor.

2. A method as in clause 1 wherein a component of the first bond-and-release system is converted from solid to a decomposed state.

3. A method as in clause 2 wherein:
   the donor comprises,
   a heteroepitaxial super lattice including an indium-containing component;
   the GaN overlying the super lattice, and
   a first oxide layer overlying the GaN; and
   bonding the donor to the handle comprises bonding the first oxide layer to a second oxide layer on the handle; and
   changing the first bond-and-release system to the second state comprises thermally decomposing the indium-containing component.

4. A method as in clause 2 wherein the handle comprises a transfer substrate including a separate release layer, the method further comprising:
   bonding the transfer substrate including the GaN to a permanent handle; and
   decomposing the separate release layer to release the permanent handle including the GaN from the transfer substrate.

5. A method as in clause 4 wherein:
   the donor comprises,
   a heteroepitaxial super lattice including an indium-containing component, and
   the GaN overlying the super lattice; and
   changing the first bond-and-release system to the second state comprises thermally decomposing the indium-containing component.

6. A method as in clause 5 further comprising forming a first oxide layer on the GaN of the transfer substrate, wherein bonding the transfer substrate to the permanent handle comprises bonding the first oxide layer to a second oxide layer on the permanent handle.

7. A method as in clause 5 wherein the separate release layer comprises InN.

8. A method as in clause 5 wherein thermally decomposing the Indium-containing component comprises thermal lift off.

9. A method as in clause 5 wherein thermally decomposing the Indium-containing component comprises laser lift off.

10. A method as in clause 5 wherein the indium-containing component comprises GaInN.

11. A method as in clause 5 wherein the indium-containing component comprises $Ga_{0.85}In_{0.15}N$.

12. A method comprising:
    providing a donor comprising GaN and having a cleave plane formed by implanted particles;
    bonding the donor to a transfer substrate utilizing a bond-and-release system in a first state;
    cleaving the donor along the cleave plane to produce the transfer substrate including GaN;
    bonding the transfer substrate including GaN to a permanent handle; and
    changing a component of the bond-and-release system into a liquid to release the permanent handle including the GaN from the transfer substrate.

13. A method as in clause 12 wherein the component of the bond-and-release system comprises a solder phase.

14. A method as in clause 13 wherein the solder phase comprises Copper, Indium, Tin, Silver, Gold, Nickel, and/or Titanium.

15. A method as in clause 13 wherein the transfer substrate comprises glass.

16. A method as in clause 15 wherein the solder phase is changed into liquid by applying a beam through the glass.

17. A method as in clause 12 wherein the component of the bond-and-release system is changed into the liquid by applying a thermal lift off technique.

18. A method as in clause 12 wherein the component of the bond-and-release system comprises indium.

19. A method as in clause 18 wherein the transfer substrate comprises glass.

20. A method as in clause 19 wherein the component of the bond-and-release system is thermally decomposed by applying a beam through the glass.

21. A method as in clause 12 further comprising providing a separate release layer on the transfer substrate.

22. A method as in clause 21 wherein the separate release layer comprises InN.

23. A method as in clause 12 further comprising providing an adhesion layer on the transfer substrate.

24. A method as in clause 23 wherein the adhesion layer comprises titanium.

25. A method as in clause 12 further comprising forming a first oxide layer on the GaN of the transfer substrate, wherein bonding the transfer substrate to the permanent handle comprises bonding the first oxide layer to a second oxide layer on the permanent handle.

26. A structure comprising:
a GaN substrate implanted with particles through a face to form a cleave region;
a first metal layer overlying the face;
a solder in contact with the first metal layer; and
a second metal layer in contact with the solder and overlying a releasable substrate.

27. A structure as in clause 26 further comprising an adhesion layer between the first metal layer and the GaN material.

28. A structure as in clause 27 wherein the adhesion layer comprises Ti.

29. A structure as in clause 26 further comprising an adhesion layer between the second metal layer and the releasable substrate.

30. A structure as in clause 29 wherein the adhesion layer comprises Ti.

31. A structure as in clause 26 wherein:
the first metal layer is selected from copper, silver, gold, or nickel; and
the solder is selected from indium or tin.

32. A structure comprising:
a cleaved GaN layer having a first face and a second face;
a solder between the first face and a releasable substrate; and
a permanent substrate bonded to the second face.

33. A structure as in clause 32 wherein the solder is selected from a Cu/Sn phase, a Cu/In phase, an Ag/Sn phase, an Ag/In phase, an Au/Sn phase, an Au/In phase, or a Ni/Sn phase.

34. A structure as in clause 33 further comprising an adhesion layer between the solder and the first face.

35. A structure as in clause 34 wherein the adhesion layer comprises Ti.

36. A method comprising:
providing a donor comprising GaN and having a cleave plane formed by implanted particles;
bonding the donor to a transfer substrate utilizing a bond-and-release system in a first state;
cleaving the donor along the cleave plane to produce the transfer substrate including GaN;
bonding the transfer substrate including GaN to a permanent handle; and
changing a component of the bond-and-release system into a decomposed state to release the permanent handle including the GaN from the transfer substrate.

37. A method as in clause 36 wherein the component of the bond-and-release system comprises indium.

38. A method as in clause 37 wherein the transfer substrate comprises glass.

39. A method as in clause 38 wherein the component of the bond-and-release system is thermally decomposed by applying a beam through the glass.

40. A method as in clause 36 further comprising providing a separate release layer on the transfer substrate.

41. A method as in clause 40 wherein the separate release layer comprises InN.

42. A method as in clause 36 further comprising providing an adhesion layer on the transfer substrate.

43. A method comprising:
providing a donor comprising GaN and having a release plane formed by implanted particles wherein a GaN film is above the release plane;
bonding the donor to a transfer substrate utilizing a bond-and-release system in a first state;
using a thermal beam to separate the donor along the release plane to produce the transfer substrate including said GaN film;
bonding the transfer substrate including GaN to a permanent handle; and
changing a component of the bond-and-release system into a second state to release the permanent handle including the GaN from the transfer substrate.

44. A method as in clause 43 wherein the component of the bond-and-release system comprises indium.

45. A method as in clause 44 wherein the transfer substrate comprises glass.

46. A method as in clause 45 wherein the component of the bond-and-release system is thermally decomposed by applying a beam through the glass.

47. A method as in clause 45 wherein the component of the bond-and-release system undergoes a phase change by applying a beam through the glass.

48. A method as in clause 43 further comprising providing a separate release layer on the transfer substrate.

49. A method as in clause 48 wherein the separate release layer comprises InN.

50. A method as in clause 43 further comprising providing an adhesion layer on the transfer substrate.

51. A method as in clause 43 wherein the thermal beam is a laser beam.

52. A method as in clause 51 where the laser beam is a Q-switched laser with a center wavelength between 380 nm to 850 nm.

53. A method as in clause 52 where the laser has a pulse width between 10 psec and 100 nsec.

54. A method comprising:
providing a donor comprising GaN and having a release plane formed by implanted particles wherein a GaN film is above the release plane;
bonding the donor to a permanent handle;
using a thermal beam to separate the donor along the release plane to produce the transfer substrate including said GaN film.

55. A method as in clause 54 wherein the thermal beam is a laser beam.

56. A method as in clause 55 where the laser beam is a Q-switched laser with a center wavelength between 380 nm to 850 nm.

57. A method as in clause 56 where the laser has a pulse width between 10 psec and 100 nsec.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions or deuterium and hydrogen ions to allow for formation of the cleave plane with a modified dose and/or cleaving properties according to alternative embodiments. Still further, the particles can be introduced by a diffusion process rather than an implantation process. Of course there can be other variations, modifications, and alternatives. Therefore, the above description and illustrations should not be taken as limiting the scope of the present invention which is defined by the appended claims.

What is claimed is:

1. A method comprising:
   providing a donor comprising GaN and having a cleave plane formed by implanted particles wherein a GaN film is above the cleave plane;
   bonding the donor to a transfer substrate utilizing a bond-and-release system in a first state, wherein a reflector layer comprising deposited aluminum metal is disposed between the GaN film and the bond-and-release system;
   using a thermal cleave process to separate the donor along the cleave plane to produce the transfer substrate including said GaN film;
   bonding the transfer substrate including GaN to a permanent handle; and
   changing a component of the bond-and-release system into a second state to release the permanent handle including the GaN from the transfer substrate.

2. A method as in claim 1 wherein the component of the bond-and-release system comprises indium.

3. A method as in claim 1 wherein the transfer substrate comprises aluminum nitride or mullite.

4. A method as in claim 1 wherein the permanent substrate comprises mullite or aluminum nitride.

5. A method as in claim 1 wherein the coefficient of thermal expansion (CTE) of the transfer substrate within the temperature range of 30-400° C. is chosen to be within +/−0.75ppm/° C. of the CTE of the GaN bond surface.

6. A method as in claim 1 wherein the component of the bond-and-release system is changed by thermal decomposition by applying energy through the transfer substrate.

7. A method as in claim 1 wherein the component of the bond-and-release system undergoes a phase change by applying energy through the transfer substrate.

8. A method as in claim 1 further comprising providing a release layer on the transfer substrate.

9. A method as in claim 1 further comprising providing a release layer on the donor substrate.

10. A method as in claim 1 further comprising providing a release layer comprising InN.

11. A method as in claim 1 further comprising providing an adhesion layer on the transfer substrate.

12. A method as in claim 1 wherein the thermal cleave process is a global heating process.

13. A method as in claim 1 wherein the thermal cleave process is a beam process.

14. A method as in claim 13 wherein the beam process is a laser beam.

15. A method as in claim 14 wherein the laser beam is a pulsed laser with a center wavelength between 250 nm to 850 nm.

16. A method as in claim 14 wherein the laser beam has a pulse width between 100 fsec and 100 nsec.

17. A method comprising:
    providing a donor comprising GaN and having a cleave plane formed by implanted particles wherein a GaN film is above the cleave plane;
    bonding the donor to a handle substrate including a reflector layer comprising deposited aluminum metal;
    using a thermal cleave process to separate the donor along the cleave plane to produce a transfer substrate including said GaN film, wherein the thermal cleave process is a beam process and the beam process is a laser beam, and wherein the laser beam has a pulse width between 100 fsec and 100 nsec.

18. A method as in claim 17 wherein the handle substrate comprises mullite or aluminum nitride.

19. A method as in claim 17 wherein the coefficient of thermal expansion (CTE) of the handle substrate within the temperature range of 30-400° C. is chosen to be within +/−0.75ppm/° C. of the CTE of the GaN bond surface.

20. A method as in claim 17 wherein the thermal cleave process further comprises a global heating process.

21. A method as in claim 17 wherein the laser beam is a pulsed laser with a center wavelength between 250 nm to 850 nm.

22. A method as in claim 17 wherein the transfer substrate comprises aluminum nitride or mullite.

23. A method as in claim 17 wherein the coefficient of thermal expansion (CTE) of the transfer substrate within the temperature range of 30-400° C. is chosen to be within +/−0.75ppm/° C. of the CTE of the GaN bond surface.

24. A method as in claim 17 further comprising providing a release layer on the transfer substrate.

25. A method as in claim 17 further comprising providing a release layer comprising InN.

26. A method as in claim 17 further comprising providing an adhesion layer on the transfer substrate.

* * * * *